US012575264B2

(12) United States Patent
Li et al.

(10) Patent No.: US 12,575,264 B2
(45) Date of Patent: Mar. 10, 2026

(54) DISPLAY SUBSTRATE AND DISPLAY DEVICE

(71) Applicants: Chengdu BOE Optoelectronics Technology Co., Ltd., Chengdu (CN); BOE TECHNOLOGY GROUP CO., LTD., Beijing (CN); Beijing BOE Technology Development Co., Ltd., Beijing (CN)

(72) Inventors: Haoyu Li, Beijing (CN); Ling Shi, Beijing (CN); Fei Fang, Beijing (CN); Hongbo Ma, Beijing (CN); Lujiang Huangfu, Beijing (CN)

(73) Assignees: Chengdu BOE Optoelectronics Technology Co., Ltd., Chengdu (CN); BOE TECHNOLOGY GROUP CO., LTD., Beijing (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 18/995,570

(22) PCT Filed: Apr. 1, 2024

(86) PCT No.: PCT/CN2024/085180
§ 371 (c)(1),
(2) Date: Jan. 16, 2025

(87) PCT Pub. No.: WO2025/208265
PCT Pub. Date: Oct. 19, 2025

(65) Prior Publication Data
US 2025/0393395 A1 Dec. 25, 2025

(51) Int. Cl.
*G09G 3/32* (2016.01)
*G09G 3/3233* (2016.01)
(Continued)

(52) U.S. Cl.
CPC ....... *H10K 59/1213* (2023.02); *G09G 3/3233* (2013.01); *H10K 59/131* (2023.02);
(Continued)

(58) Field of Classification Search
CPC ............. H10K 59/1213; H10K 59/131; G09G 3/3233; G09G 2300/0426;
(Continued)

(56) References Cited

U.S. PATENT DOCUMENTS

2019/0131371 A1* 5/2019 Yi ........................ H10D 86/481
2019/0341431 A1* 11/2019 Lee ...................... G09G 3/3258
(Continued)

FOREIGN PATENT DOCUMENTS

CN 109859687 A 6/2019
CN 111739916 A 10/2020
(Continued)

*Primary Examiner* — Pegeman Karimi
(74) *Attorney, Agent, or Firm* — Westman, Champlin & Koehler, P.A.

(57) ABSTRACT

A display substrate includes a base substrate and sub-pixels. The sub-pixel includes a light-emitting element and a driving circuit. The driving circuit includes first to third transistors and a first storage capacitor. The second transistor includes an active portion including a channel portion and first and second electrodes respectively connected to the channel portion on opposite sides of the channel portion. The channel portion includes first and second sub-channel portions and a channel connection portion connected between the first and second sub-channel portions. The display substrate further includes a shielding portion, a layer where the shielding portion is located is on a side of a layer where the active portion of the second transistor is located away from the base substrate. An orthographic projection of the shielding portion on the base substrate at least partially
(Continued)

overlaps with an orthographic projection of the channel connection portion on the base substrate.

20 Claims, 26 Drawing Sheets

(51) Int. Cl.
H10K 59/121 (2023.01)
H10K 59/131 (2023.01)
(52) U.S. Cl.
CPC .............. *G09G 2300/0426* (2013.01); *G09G 2300/0819* (2013.01); *G09G 2300/0842* (2013.01); *G09G 2330/021* (2013.01)
(58) Field of Classification Search
CPC ... G09G 2300/0819; G09G 2300/0842; G09G 2330/021
See application file for complete search history.

(56) References Cited

U.S. PATENT DOCUMENTS

| | | | |
|---|---|---|---|
| 2022/0320220 A1 | 10/2022 | Wang et al. | |
| 2022/0352291 A1 | 11/2022 | Park et al. | |
| 2023/0354642 A1 | 11/2023 | Wang et al. | |
| 2024/0363073 A1* | 10/2024 | Wang .................... | G09G 3/3233 |
| 2024/0386847 A1* | 11/2024 | Zhang ..................... | G09G 3/32 |

FOREIGN PATENT DOCUMENTS

| | | |
|---|---|---|
| CN | 115050340 A | 9/2022 |
| CN | 116884336 A | 10/2023 |
| CN | 117766545 A | 3/2024 |
| WO | 2022267001 A1 | 12/2022 |

* cited by examiner

24

23

Y

X

43(M1)

L3

24(M2)

V03

34(M2)

L4

24(M3)

V04

V05

DISPLAY SUBSTRATE AND DISPLAY DEVICE

CROSS REFERENCE TO RELATED APPLICATION(S)

This application is a Section 371 National Stage Application of International Application No. PCT/CN2024/085180, filed on Apr. 1, 2024, entitled "DISPLAY SUBSTRATE AND DISPLAY DEVICE", not in English, the contents of which are incorporated herein by reference in their entireties.

TECHNICAL FIELD

The present disclosure relates to a field of display technology, and in particular to a display substrate and a display device.

BACKGROUND

With the continuous development of display technology, organic light-emitting diode (OLED) display devices have become the research hotspot and technology development direction of major manufacturers due to their advantages such as wide color gamut, high contrast ratio, thin and light design, self-luminescence, and wide viewing angle.

The above information disclosed in this section is only for understanding the background of the inventive concept of the present disclosure and therefore the above information may contain information that does not constitute the related art.

SUMMARY

In an aspect, a display substrate is provided, including a display region and a peripheral region around the display region. The display substrate includes: a base substrate; and a plurality of sub-pixels on the base substrate, arranged in the display region in a first direction and/or a second direction, the first direction intersecting with the second direction, where the sub-pixel includes a light-emitting element and a driving circuit electrically connected to the light-emitting element, the driving circuit includes a plurality of transistors and at least one storage capacitor, the plurality of transistors include a first transistor, a second transistor and a third transistor, and the at least one storage capacitor includes a first storage capacitor, where a first electrode of the first transistor is configured to receive a data signal, and a second electrode of the first transistor is electrically connected to a second electrode plate of the first storage capacitor; a first electrode of the second transistor is electrically connected to a second electrode of the third transistor, and a second electrode of the second transistor is electrically connected to a gate of the third transistor; and a first electrode of the third transistor is configured to receive a first power signal, and the gate of the third transistor is electrically connected to a first electrode plate of the first storage capacitor. The second transistor includes an active portion, the active portion of the second transistor includes a channel portion and a first electrode and a second electrode respectively connected to the channel portion on opposite sides of the channel portion, and the channel portion includes a first sub-channel portion, a second sub-channel portion, and a channel connection portion connected between the first sub-channel portion and the second sub-channel portion. The display substrate further includes a shielding portion on the base substrate, a layer where the shielding portion is located is arranged on a side of a layer where the active portion of the second transistor is located away from the base substrate, and an orthographic projection of the shielding portion on the base substrate at least partially overlaps with an orthographic projection of the channel connection portion on the base substrate.

According to some exemplary embodiments, the shielding portion is configured to receive a constant voltage signal.

According to some exemplary embodiments, the plurality of transistors further include a fourth transistor, a first electrode of the fourth transistor is configured to receive a first initialization signal, a second electrode of the fourth transistor is electrically connected to the gate of the third transistor, and the shielding portion is configured to receive the first initialization signal.

According to some exemplary embodiments, the display substrate further includes a first initialization signal line configured to transmit the first initialization signal, where the shielding portion is electrically connected to the first initialization signal line.

According to some exemplary embodiments, the display substrate includes a third conductive layer on the base substrate and a second conductive layer on a side of the third conductive layer away from the base substrate, where the first initialization signal line is arranged in the second conductive layer; the second conductive layer further includes a first initialization connection portion spaced apart from the first initialization signal line, the third conductive layer includes a second initialization connection portion, the second initialization connection portion is electrically connected to the first initialization signal line and the first initialization connection portion, and the first initialization connection portion is further electrically connected to the first electrode of the fourth transistor; and the shielding portion is arranged in the third conductive layer, and the shielding portion and the second initialization connection portion are connected to form an integral structure.

According to some exemplary embodiments, a second electrode of the light-emitting element is configured to receive a second power signal, and the shielding portion is configured to receive the second power signal.

According to some exemplary embodiments, the display substrate further includes a second power signal transmission structure configured to transmit the second power signal, where the shielding portion is electrically connected to the second power signal transmission structure.

According to some exemplary embodiments, the display substrate includes a second conductive layer on the base substrate and a first conductive layer on a side of the second conductive layer away from the base substrate. The second power signal transmission structure includes a second power signal line arranged in the first conductive layer and a second power grid line arranged in the second conductive layer, the second power grid line extends in the first direction, the second power signal line extends in the second direction, and the second power grid line is electrically connected to the second power signal line. The shielding portion is arranged in the first conductive layer, and the shielding portion and the second power signal line are connected to form an integral structure.

According to some exemplary embodiments, the shielding portion is configured to receive the first power signal; or the plurality of transistors further include a fifth transistor, a first electrode of the fifth transistor is configured to receive a reference voltage signal, a second electrode of the fifth transistor is electrically connected to the second electrode of the first transistor, and the shielding portion is configured to receive the reference voltage signal; or the plurality of transistors further include an eighth transistor, a first electrode of the eighth transistor is configured to receive a second initialization signal, a second electrode of the eighth transistor is electrically connected to a first electrode of the light-emitting element, and the shielding portion is configured to receive the second initialization signal.

According to some exemplary embodiments, the display substrate further includes a scanning signal line configured to transmit a scanning signal to a gate of the second transistor, the orthographic projection of the shielding portion on the base substrate is spaced apart from an orthographic projection of the scanning signal line on the base substrate, and/or the orthographic projection of the shielding portion on the base substrate is spaced apart from an orthographic projection of the gate of the second transistor on the base substrate.

According to some exemplary embodiments, the display substrate includes an active layer on the base substrate and a light shielding layer between the active layer and the base substrate, where a plurality of active portions of the plurality of transistors are arranged in the active layer, and an orthographic projection of the light shielding layer on the base substrate at least partially overlaps with orthographic projections of the plurality of active portions on the base substrate.

According to some exemplary embodiments, the plurality of transistors further include a fourth transistor, a fifth transistor, a sixth transistor, a seventh transistor, and an eighth transistor. A first electrode of the fourth transistor is configured to receive a first initialization signal, and a second electrode of the fourth transistor is electrically connected to the gate of the third transistor; a first electrode of the fifth transistor is configured to receive a reference voltage signal, and a second electrode of the fifth transistor is electrically connected to the second electrode of the first transistor; a first electrode of the sixth transistor is configured to receive to the reference voltage signal, and a second electrode of the sixth transistor is electrically connected to the second electrode of the first transistor; a first electrode of the seventh transistor is electrically connected to the second electrode of the third transistor, and a second electrode of the seventh transistor is electrically connected to a first electrode of the light-emitting element; and a first electrode of the eighth transistor is configured to receive a second initialization signal, and a second electrode of the eighth transistor is electrically connected to the first electrode of the light-emitting element. Each of a gate of the first transistor and a gate of the second transistor is configured to receive to a scanning signal, each of a gate of the fourth transistor, a gate of the fifth transistor and a gate of the eighth transistor is configured to receive to a reset signal, and each of a gate of the sixth transistor and a gate of the seventh transistor is configured to receive to a light-emitting control signal. The orthographic projection of the light shielding layer on the base substrate at least partially overlaps with an orthographic projection of each of an active portion of the first transistor, the active portion of the second transistor, an active portion of the third transistor, an active portion of the fourth transistor, an active portion of the fifth transistor and an active portion of the eighth transistor on the base substrate.

According to some exemplary embodiments, the light shielding layer is configured to receive the first power signal.

According to some exemplary embodiments, the display substrate further includes a first power signal transmission structure configured to transmit the first power signal. The first power signal transmission structure includes a plurality of first power signal lines and a plurality of first power signal connection portions, the plurality of first power signal lines are arranged in the first direction and extend in the second direction, the first power signal connection portion is electrically connected to the first power signal line and the first electrode of the third transistor. The display substrate includes a second conductive layer on a side of the active layer away from the base substrate and a first conductive layer on a side of the second conductive layer away from the base substrate, the plurality of first power signal lines are arranged in the first conductive layer, and the plurality of first power signal connection portions are arranged in the second conductive layer. The light shielding layer is electrically connected to at least one of the plurality of first power signal connection portions.

According to some exemplary embodiments, the plurality of transistors further includes a fifth transistor, a first electrode of the fifth transistor is configured to receive a reference voltage signal, a second electrode of the fifth transistor is electrically connected to the second electrode of the first transistor, and the light shielding layer is configured to receive the reference voltage signal.

According to some exemplary embodiments, the display substrate further includes a reference voltage signal line configured to transmit the reference voltage signal, where the display substrate further includes: a second conductive layer on a side of the active layer away from the base substrate, and the reference voltage signal line being arranged in the second conductive layer; and a first insulation layer between the light shielding layer and the active layer and a second insulation layer between the active layer and the second conductive layer, where the second insulation layer includes a first via hole, and the first insulation layer and the second insulation layer include a second via hole, the first via hole exposes at least part of the first electrode of the fifth transistor, the second via hole exposes at least part of the light shielding layer, the reference voltage signal line is electrically connected to the first electrode of the fifth transistor through the first via hole, and the reference voltage signal line is electrically connected to the light shielding layer through the second via hole. An orthographic projection of the second via hole on the base substrate is adjacent to an orthographic projection of the first via hole on the base substrate.

According to some exemplary embodiments, the display substrate includes a driving circuit layer on the base substrate and a light-emitting element layer on a side of the driving circuit layer away from the base substrate, each driving circuit is arranged in the driving circuit layer, and each light-emitting element is arranged in the light-emitting element layer. The display substrate includes a second power signal transmission structure arranged in the driving circuit layer and configured to transmit a second power signal, and the second power signal transmission structure includes at least one auxiliary electrode arranged in the display region. The light-emitting element layer includes a first electrode layer on the side of the driving circuit layer away from the base substrate, a light-emitting function layer on a side of the first electrode layer away from the base substrate, and a second electrode layer on a side of the light-emitting function layer away from the base substrate, the second electrode layer is electrically connected to the at least one auxiliary electrode.

According to some exemplary embodiments, the driving circuit layer includes a second conductive layer on the base substrate and a first conductive layer on a side of the second conductive layer away from the base substrate; and the second power signal transmission structure includes a second power signal line and a second power grid line, the second power signal line extends in the second direction and is arranged in the first conductive layer, the second power grid line extends in the first direction and is arranged in the second conductive layer, and the second power grid line is electrically connected to the second power signal line. The auxiliary electrode is arranged in the first conductive layer, and the auxiliary electrode and the second power signal line are connected to form an integral structure.

According to some exemplary embodiments, the first electrode layer includes a plurality of first electrodes arranged at intervals, and an orthographic projection of the auxiliary electrode on the base substrate is located between orthographic projections of at least two of the plurality of first electrodes on the base substrate.

In another aspect, a display device is provided, including any display substrate described above.

BRIEF DESCRIPTION OF THE DRAWINGS

Features and advantages of the present disclosure will become more clear by describing exemplary embodiments of the present disclosure in detail with reference to the accompanying drawings.

FIG. 16A shows an active layer; FIG. 16B shows a first gate metal layer; FIG. 16C shows a second gate metal layer; FIG. 16D shows an interlayer insulation layer; FIG. 16E shows a first source and drain metal layer; FIG. 16F shows a passivation layer; FIG. 16G shows a first planarization layer; and FIG. 16H shows a second source and drain metal layer.

DETAILED DESCRIPTION OF EMBODIMENTS

Figure 1:
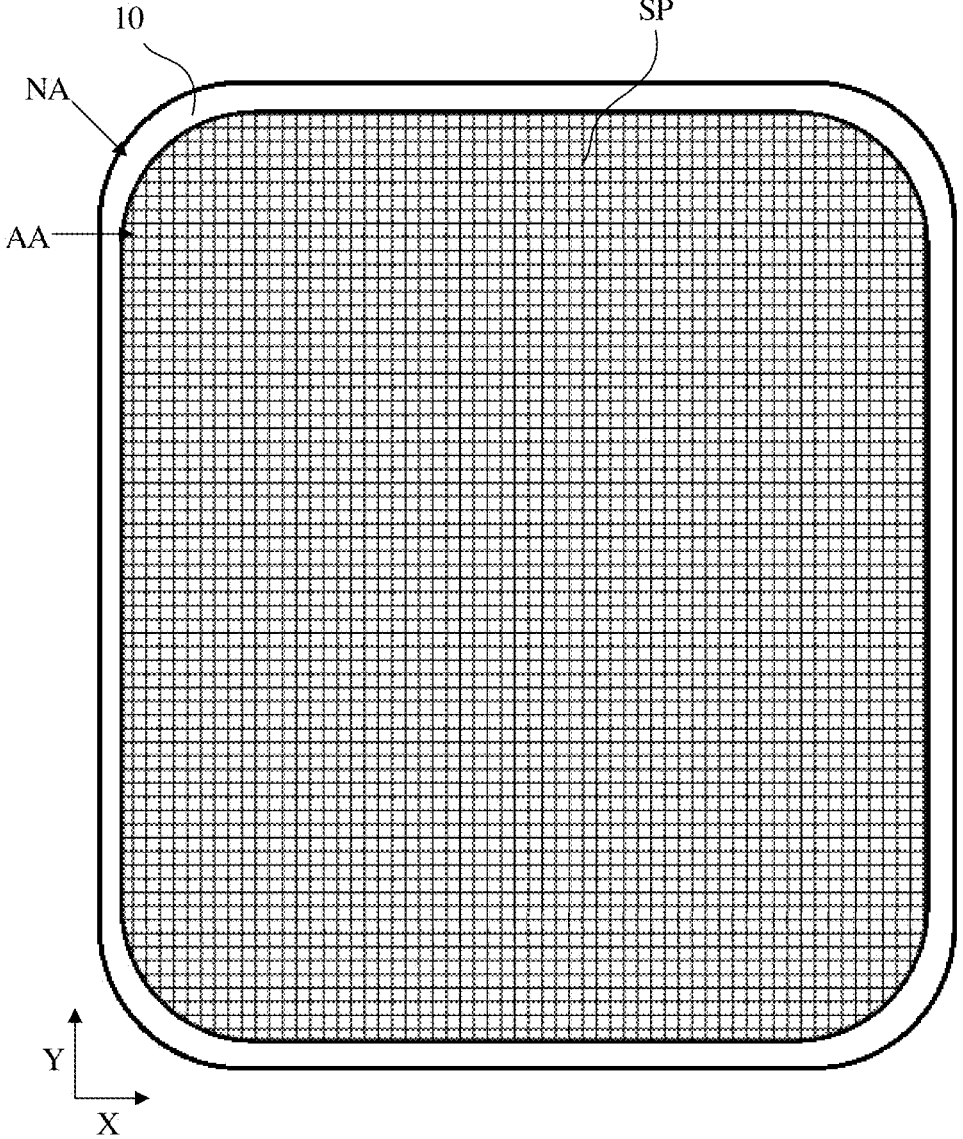
FIG. 1 schematically shows a plan view of a display substrate according to some embodiments of the present disclosure.

In order to make the purpose, technical solutions and advantages of embodiments of the present disclosure more clear, the technical solutions in embodiments of the present disclosure will be clearly and completely described below in conjunction with the accompanying drawings. Obviously, the described embodiments are only part of embodiments of the present disclosure, rather than all embodiments. Based on the described embodiments of the present disclosure, all other embodiments obtained by those of ordinary skill in the art without inventive efforts fall within the protection of scope of the present disclosure.

It will be noted that in the drawings, size(s) and relative size(s) of element(s) may be exaggerated for clarity and/or description. As such, sizes and relative sizes of the various elements are not necessarily limited to the sizes and relative sizes shown in the drawings. In the specification and the drawings, the same or similar reference numerals indicate the same or similar parts.

When an element is described as being "on", "connected to", or "coupled to" another element, the element may be directly on, directly connected to, or directly coupled to the other element, or there may be an intervening element. However, when an element is described as being "directly on", "directly connected to", or "directly coupled to" another element, there are no intervening element. Other terms and/or expressions used to describe the relationship between elements should be interpreted in a similar manner, for example, "between" versus "directly between", "adjacent" versus "directly adjacent", or "on" versus "directly on", etc. In addition, the term "connection" may refer to a physical connection, an electrical connection, a communication connection, and/or a fluid connection. In addition, the X-axis, Y-axis, and Z-axis are not limited to the three axes of a rectangular coordinate system and they may be interpreted in a broader sense. For example, the X-axis, Y-axis, and Z-axis may be perpendicular to each other, or may represent different directions that are not perpendicular to each other. According to the present disclosure, "at least one of X, Y, or Z" and "at least one selected from a group consisting of X, Y, and Z" may be interpreted as only X, only Y, only Z, or any combination of two or more of X, Y, and Z, such as XYZ, XY, YZ, and XZ. As used herein, the term "and/or" includes any and all combinations of one or more of the listed related items.

It will be noted that the terms "first", "second", etc. may be used herein to describe various components, members, elements, regions, layers and/or portions, however, these components, members, elements, regions, layers and/or portions should not be limited by these terms. Rather, these terms are used to distinguish one component, member, element, region, layer and/or portion from another one. Accordingly, for example, a first component, a first member, a first element, a first region, a first layer and/or a first portion discussed below could be termed a second component, a second member, a second element, a second region, a second layer and/or a second portion without departing from the teachings of the present disclosure.

For ease of description, spatially relative terms, such as "upper," "lower," "left," "right," etc. may be used herein to describe the relationship of one element or feature to another element or feature as shown in the figures. It will be understood that the spatially relative terms are intended to encompass different orientations of the device in use or operation in addition to the orientation depicted in the figures. For example, if a device in the figures is turned over, elements described as "below" or "beneath" other elements or features would then be oriented "above" or "over" the other elements or features.

In the present disclosure, the terms "substantially", "about", "approximately", "roughly" and other similar terms are used as terms of approximation rather than terms of degree, and they are intended to account for the inherent variations in measurements or calculations that would be recognized by those of ordinary skill in the art. As used herein, "about" or "approximately" are inclusive of the stated value and indicate that the particular value is within an acceptable range of deviation as determined by one of ordinary skill in the art to take into account factors such as process variations, measurement problems, and errors associated with the measurement of a particular quantity (i.e., limitations of the measurement system). For example, "about" may mean within one or more standard deviations, or within ±30%, ±20%, ±10%, ±5% of the stated value.

It will be noted that, in the present disclosure, "the same layer" refers to a layer structure formed by using the same film formation process to form a film for forming a specific pattern, and then patterning the film through a single patterning process with the same mask. Depending on the specific pattern, a single patterning process may include a plurality of exposure, development or etching processes, and the specific pattern in the formed layer structure may be continuous or discontinuous. That is, a plurality of elements, components, structures and/or portions located in the "same layer" are made of the same material and formed through the same patterning process. Generally, the plurality of elements, components, structures and/or portions located in the "same layer" have approximately the same thickness.

Those skilled in the art will understand that, in the present disclosure, unless otherwise specified, the expression "height" or "thickness" refers to a size of a surface of each layer perpendicular to the display substrate, that is, a size along the light emitting direction of a display substrate, or a size along the normal direction of the display device.

In the present disclosure, the term "transistor" may refer to a triode, a thin film transistor, a field effect transistor or other devices having the same characteristics. In embodiments of the present disclosure, in order to distinguish the two electrodes of a transistor other than the control electrode of the transistor, one of the two electrodes is called a first electrode and the other is called a second electrode. In actual operation, when the transistor is a thin film transistor or a field effect transistor, the first electrode thereof may be a drain, and the second electrode may be a source; or, the first electrode may be a source, and the second electrode may be a drain.

Figure 2:
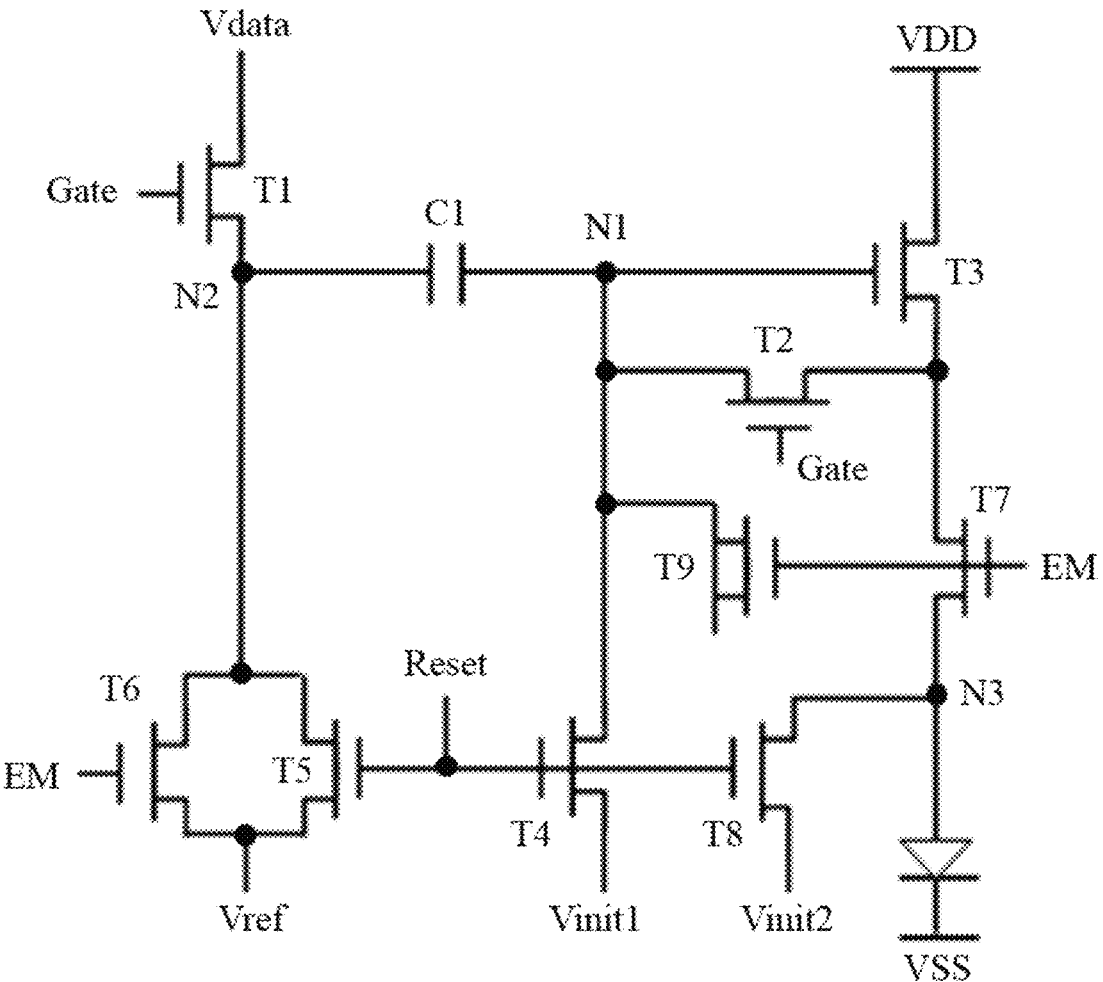
FIG. 2 schematically shows a schematic circuit diagram of a driving circuit in a display substrate according to some embodiments of the present disclosure.
Figure 3:
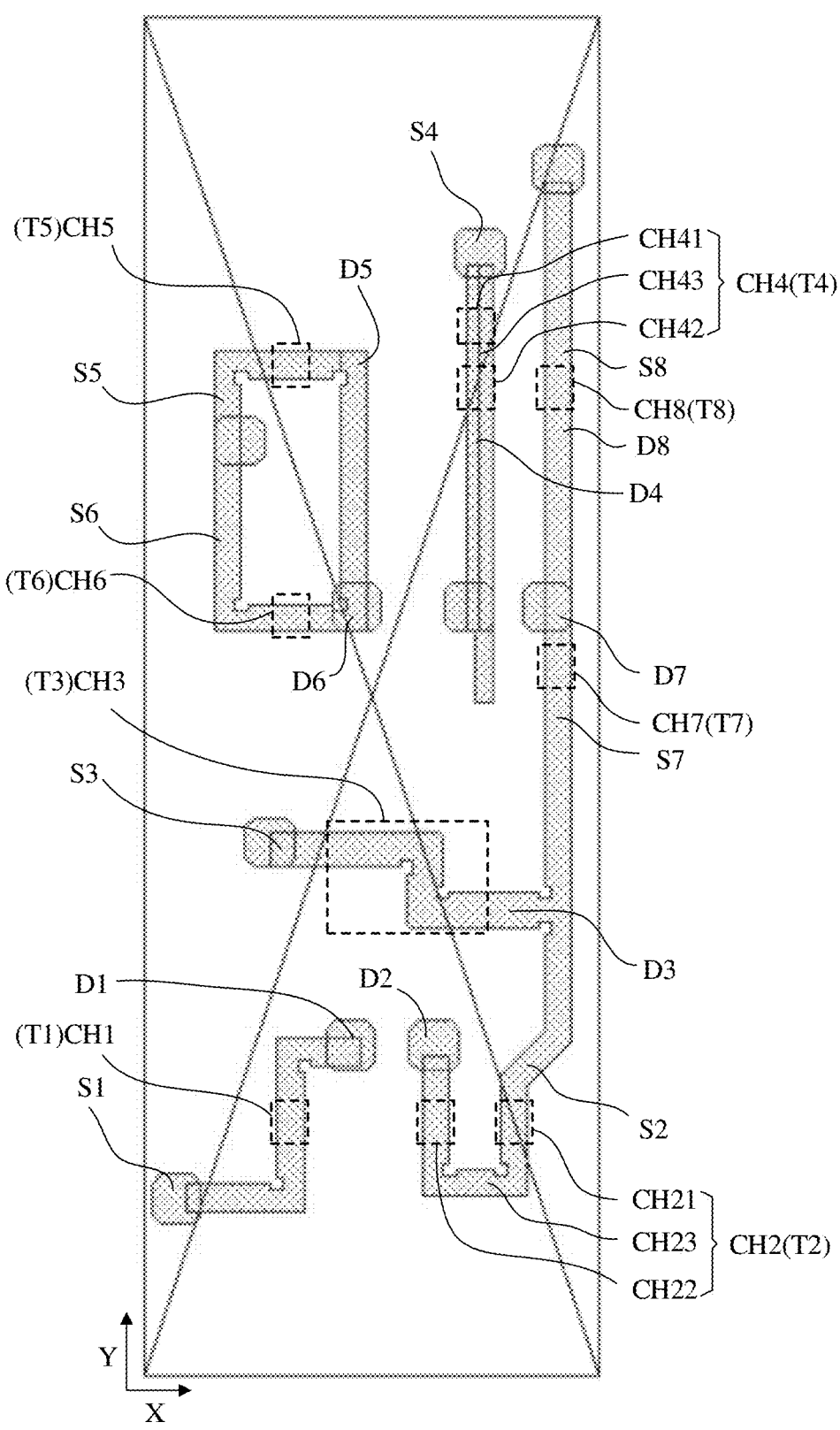
FIG. 3 schematically shows a plan view of an active layer in a display substrate according to some embodiments of the present disclosure.
Figure 4A:
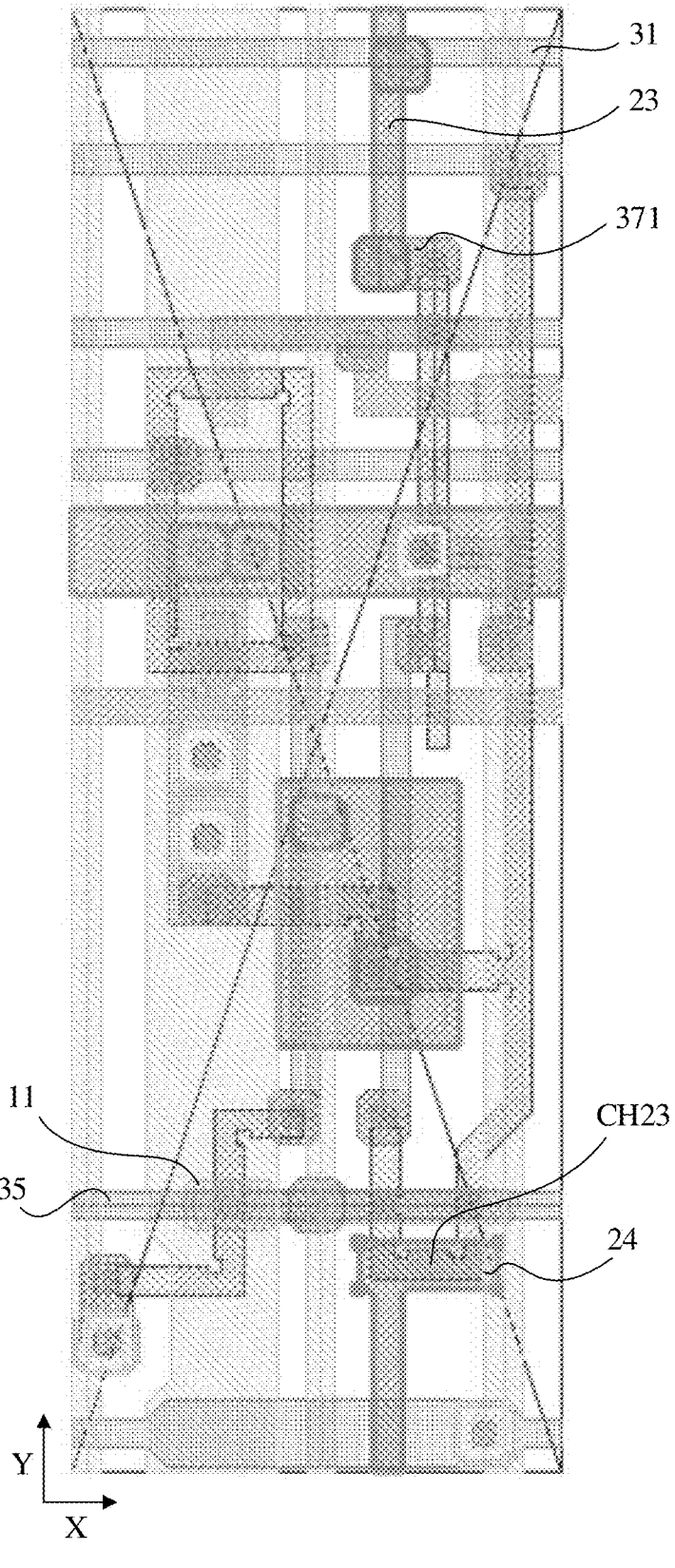
FIG. 4A schematically shows a plan view of a combination of an active layer, a fourth conductive layer, a third conductive layer, a second conductive layer and a first conductive layer in a display substrate according to some embodiments of the present disclosure.
Figure 4B:
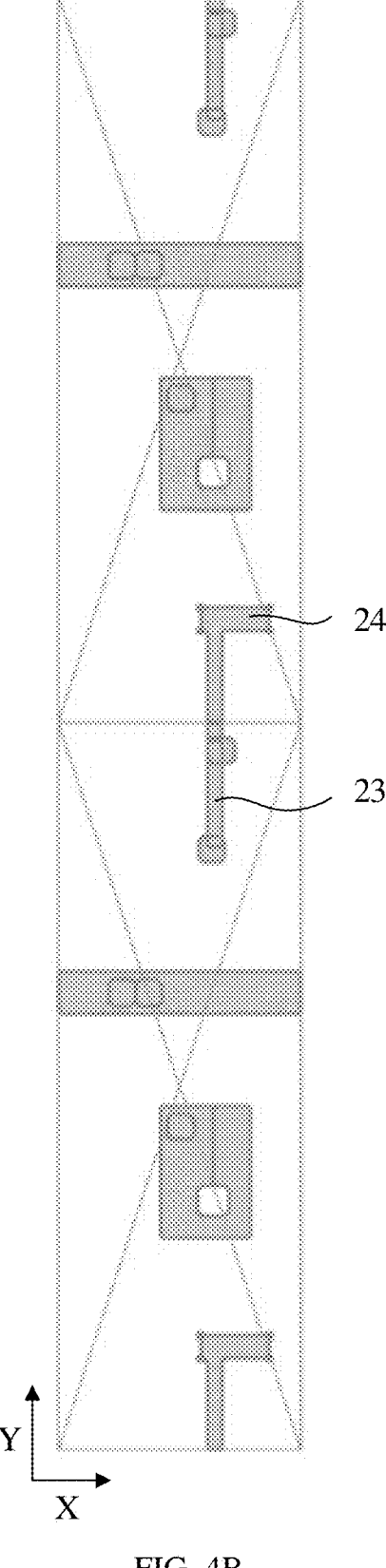
FIG. 4B schematically shows a plan view of a second conductive layer in a display substrate according to some embodiments of the present disclosure.

FIG. 1 schematically shows a plan view of a display substrate according to some embodiments of the present disclosure. FIG. 2 schematically shows a schematic circuit diagram of a driving circuit in a display substrate according to some embodiments of the present disclosure. FIG. 3 schematically shows a plan view of an active layer in a display substrate according to some embodiments of the present disclosure. FIG. 4A schematically shows a plan view of a combination of an active layer, a fourth conductive layer, a third conductive layer, a second conductive layer and a first conductive layer in a display substrate according to some embodiments of the present disclosure. FIG. 4B schematically shows a plan view of a second conductive layer in a display substrate according to some embodiments of the present disclosure.

It should be noted that in the plan views of some film layers of the display substrate provided in embodiments of the present disclosure, a rectangular block and cross lines within the rectangular block are only for illustrating an arrangement range of a driving circuit, and they are not part of the layer structure in the display substrate.

Referring to FIG. 1, a display substrate includes a display region AA and a peripheral region NA around the display region AA. The display substrate includes a base substrate 10 and a plurality of sub-pixels SP on the base substrate 10. The plurality of sub-pixels SP are arranged in the display region AA in a first direction X and a second direction Y. The first direction X intersects with the second direction Y. For example, the first direction X is perpendicular to the second direction Y. Each sub-pixel SP includes a light-emitting element and a driving circuit electrically connected to the light-emitting element, and the driving circuit is used to separately drive the light-emitting element to emit light, so as to enable the display substrate to display an image.

Specifically, the light-emitting element used in embodiments of the present disclosure may be an organic light-emitting diode (OLED). For example, the light-emitting element may be an OLED with a top emission structure, which may emit red light, green light, blue light, white light, or the like. Embodiments of the present disclosure do not limit the specific structure of the light-emitting element. For example, a first electrode of the light-emitting element is an anode of the OLED, and a second electrode of the light-emitting element is a cathode of the OLED, that is, the pixel circuits have a common cathode. However, embodiments of the present disclosure do not limit this. Based on changes in the circuit structure, the pixel circuits may have a common anode.

The display substrate used in embodiments of the present disclosure may be a rigid substrate, such as a glass substrate, a silicon substrate, etc., or may be made of a flexible material with excellent heat resistance and durability, such as polyimide (PI), polycarbonate (PC), polyethylene terephthalate (PET), polyethylene, polyacrylate, polyarylate, polyetherimide, polyethersulfone, polyethylene glycol terephthalate (PET), polyethylene (PE), polypropylene (PP), polysulfone (PSF), polymethyl methacrylate (PMMA), triacetyl cellulose (TAC), cycloolefin polymer (COP), cycloolefin copolymer (COC), etc.

According to some exemplary embodiments, the display substrate includes a driving circuit layer on the base substrate and a light-emitting element layer on a side of the driving circuit layer away from the base substrate, the driving circuits are arranged in the driving circuit layer, and the light-emitting elements are arranged in the light-emitting element layer.

For example, the driving circuit layer includes a first conductive layer on the base substrate, a second conductive layer between the first conductive layer and the base substrate, a third conductive layer between the second conductive layer and the base substrate, a fourth conductive layer between the third conductive layer and the base substrate, and an active layer between the fourth conductive layer and the base substrate.

Referring to FIG. 2, the driving circuit includes a plurality of transistors and at least one storage capacitor. The plurality of transistors include a first transistor T1, a second transistor T2, and a third transistor T3. The at least one storage capacitor includes a first storage capacitor C1.

A first electrode of the first transistor T1 is used to receive a data signal Vdata, and a second electrode of the first transistor T1 is electrically connected to a second electrode plate of the first storage capacitor C1. A first electrode of the second transistor T2 is electrically connected to a second electrode of the third transistor T3, and a second electrode of the second transistor T2 is electrically connected to a gate of the third transistor T3. A first electrode of the third transistor T3 is used to receive a first power signal VDD, and the gate of the third transistor T3 is electrically connected to a first electrode plate of the first storage capacitor C1.

Referring to FIG. 3, the display substrate includes the active layer on the base substrate, and an active portion of at least one of the transistors are arranged in the active layer. An active portion of the first transistor T1, an active portion of the second transistor T2, and an active portion of the third transistor T3 are arranged in the active layer.

For example, the active portion of the first transistor T1 includes a channel portion CH1, and the first electrode S1 and the second electrode D1 respectively connected to the channel portion CH1 on opposite sides of the channel portion CH1. The active portion of the second transistor T2 includes a channel portion CH2, and the first electrode S2 and the second electrode D2 respectively connected to the channel portion CH2 on opposite sides of the channel portion CH2. The active portion of the third transistor T3 includes a channel portion CH3, and the first electrode S3 and the second electrode D3 respectively connected to the channel portion CH3 on opposite sides of the channel portion CH3. The first electrode S2 of the second transistor T2 is directly connected to the second electrode D3 of the third transistor T3, and the active portion of the second transistor T2 and the active portion of the third transistor T3 are connected to form an integral structure. The active portion of the first transistor T1 is spaced apart from the active portion of the second transistor T2 and the active portion of the third transistor T3.

The "integral structure" in embodiments of the present disclosure refers to a structure in which two (or more) portions or components are formed through the same film formation process and patterned through the same patterning process to be connected to each other, and they may made of the same material or different materials.

Referring to FIG. 4A, a first conductive portion 11 is provided in the display substrate, and the first conductive portion 11 is arranged in the fourth conductive layer. Referring to FIG. 3, an orthographic projection of the first conductive portion 11 on the base substrate partially overlaps with an orthographic projection of the active portion of the first transistor T1 on the base substrate, and a portion of the first conductive portion 11 overlapping with the active portion of the first transistor T1 serves as a gate of the first transistor T1, and a portion of the active portion of the first transistor T1 overlapping with the first conductive portion 11 serves as the channel portion CH1 of the first transistor T1. There are two overlaps between the orthographic projection of the first conductive portion 11 on the base substrate and the orthographic projection of the active portion of the second transistor T2 on the base substrate. Two portions of the first conductive portion 11 overlapping with the active portion of the second transistor T2 serve as a first gate and a second gate of the second transistor T2, respectively. Two portions of the active portion of the second transistor T2 overlapping with the first conductive portion 11 serve as a first sub-channel portion CH21 and a second sub-channel portion CH22 of the second transistor T2, respectively. A portion connected between the first sub-channel portion CH21 and the second sub-channel portion CH22 is a channel connection portion CH23. The first sub-channel portion CH21, the second sub-channel portion CH22 and the channel connection portion CH23 jointly serve as the channel portion CH2 of the second transistor T2.

Referring to FIG. 4A, the display substrate further includes a shielding portion 24 in a layer located on a side of the active layer away from the base substrate, and an orthographic projection of the shielding portion 24 on the base substrate at least partially overlaps with an orthographic projection of the channel connection portion CH23 on the base substrate.

In the display substrate provided in embodiments of the present disclosure, the second transistor T2 is used as a threshold compensation transistor, and the second transistor T2 is implemented as a dual-gate dual-channel transistor. In addition, the shielding portion is arranged on an upper side of the channel connection portion of the second transistor T2 away from the base substrate. The shielding portion is used to shield the light incident to the channel connection portion, so that the leakage current of the second transistor T2 is effectively reduced, and thus the voltage of the node at which the gate of the third transistor and the first electrode plate of the first storage capacitor are coupled remains stable, thereby improving the driving effect of the driving circuit.

According to some exemplary embodiments, the shielding portion is used to receive a constant voltage signal.

According to some exemplary embodiments, referring to FIG. 2, the plurality of transistors further include a fourth transistor T4. A first electrode of the fourth transistor T4 is used to receive a first initialization signal Vinit1, a second electrode of the fourth transistor T4 is electrically connected to the gate of the third transistor T3, and the shielding portion 24 is used to receive the first initialization signal Vinit1.

According to some exemplary embodiments, referring to FIG. 4A, the display substrate includes a first initialization signal line 31 used to transmit the first initialization signal Vinit1, and the shielding portion 24 is electrically connected to the first initialization signal line 31, so that the shielding portion 24 receives the first initialization signal.

According to some exemplary embodiments, referring to FIG. 4A, the first initialization signal line 31 is arranged in the second conductive layer. The second conductive layer further includes a first initialization connection portion 371 spaced apart from the first initialization signal line, and the third conductive layer includes a second initialization connection portion 23. The second initialization connection portion 23 extends in the second direction Y. The second initialization connection portion 23 is electrically connected to the first initialization signal line 31 and the first initialization connection portion 371. The first initialization connection portion 371 is further electrically connected to a first electrode S4 of the fourth transistor T4. That is, the first initialization signal transmitted in the first initialization signal line 31 is provided to the first electrode S4 of the fourth transistor T4 through the second initialization connection portion 23 and the first initialization connection portion 371 in sequence. Further, referring to FIG. 4B, the shielding portion 24 is disposed in the third conductive layer, and in two adjacent driving circuits in the second direction Y, the shielding portion 24 in one of the two adjacent driving circuits and the second initialization connection portion 23 in the other of the two adjacent driving circuits are connected to form an integral structure.

According to some exemplary embodiments, referring to FIG. 2, the second electrode of the light-emitting element is used to receive to a second power signal VSS, and the shielding portion is used to receive to the second power signal VSS.

According to some exemplary embodiments, the display substrate includes a second power signal transmission structure used to transmit a second power signal, and the shielding portion is electrically connected to the second power signal transmission structure, so that the shielding portion receives the second power signal.

Figure 5A:
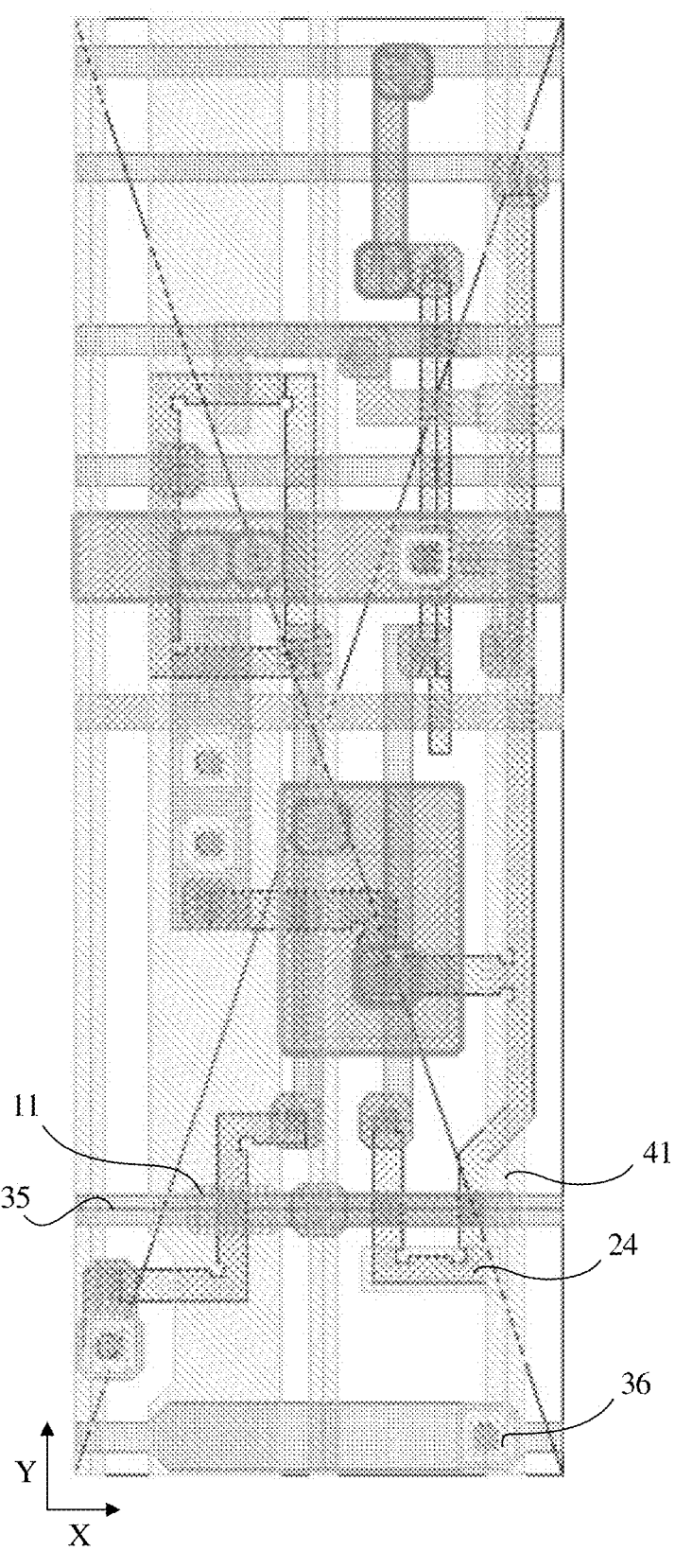
FIG. 5A schematically shows a plan view of a combination of an active layer, a fourth conductive layer, a third conductive layer, a second conductive layer and a first conductive layer in a display substrate according to some embodiments of the present disclosure.
Figure 5B:
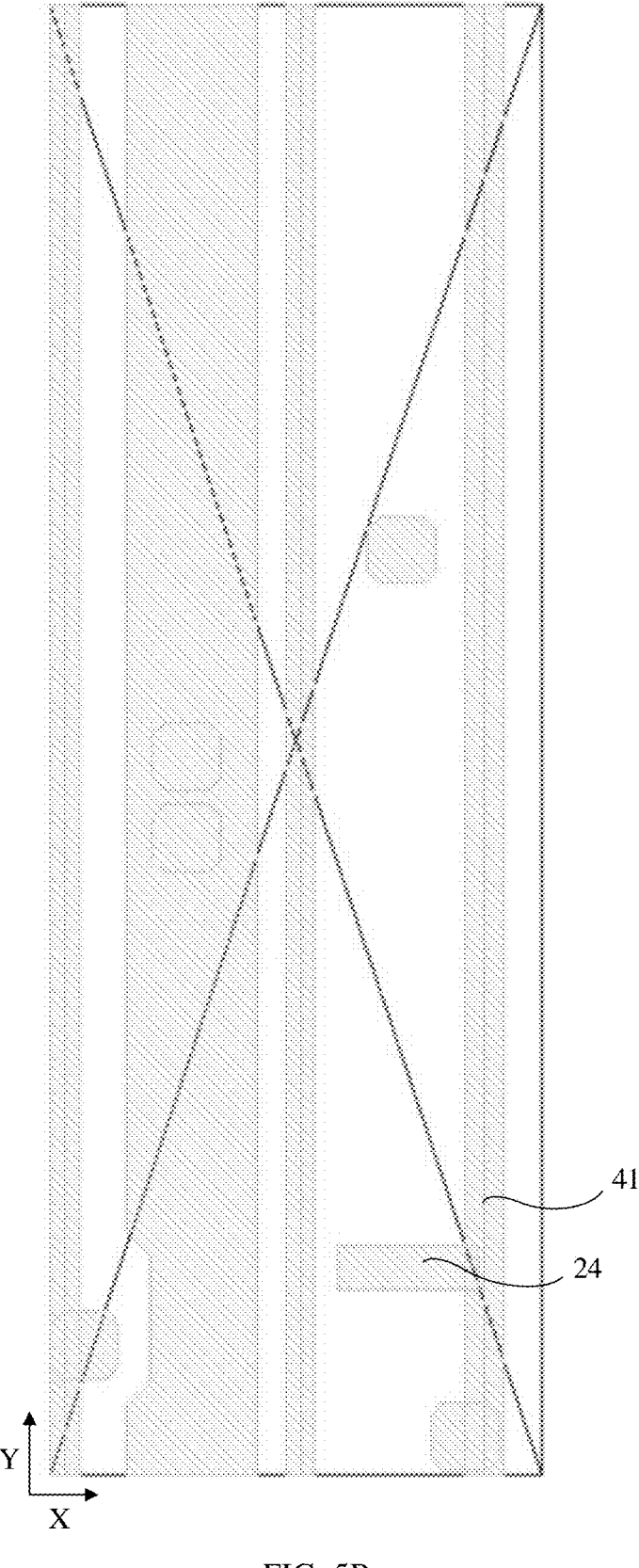
FIG. 5B schematically shows a plan view of a first conductive layer in a display substrate according to some embodiments of the present disclosure.

FIG. 5A schematically shows a plan view of a combination of an active layer, a fourth conductive layer, a third conductive layer, a second conductive layer and a first conductive layer in a display substrate according to some embodiments of the present disclosure. FIG. 5B schematically shows a plan view of a first conductive layer in a display substrate according to some embodiments of the present disclosure.

According to some exemplary embodiments, with reference to FIG. 5A and FIG. 5B, the second power signal transmission structure includes a second power signal line 41 in the first conductive layer and a second power grid line 36 in the second conductive layer. The second power grid line 36 extends in the first direction X, the second power signal line 41 extends in the second direction Y, and the second power grid line 36 is electrically connected to the second power signal line 41. Further, the shielding portion 24 is arranged in the first conductive layer, and the shielding portion 24 and the second power signal line 41 are connected to form an integral structure.

According to some exemplary embodiments, the shielding portion is used to receive the first power signal.

Figure 6A:
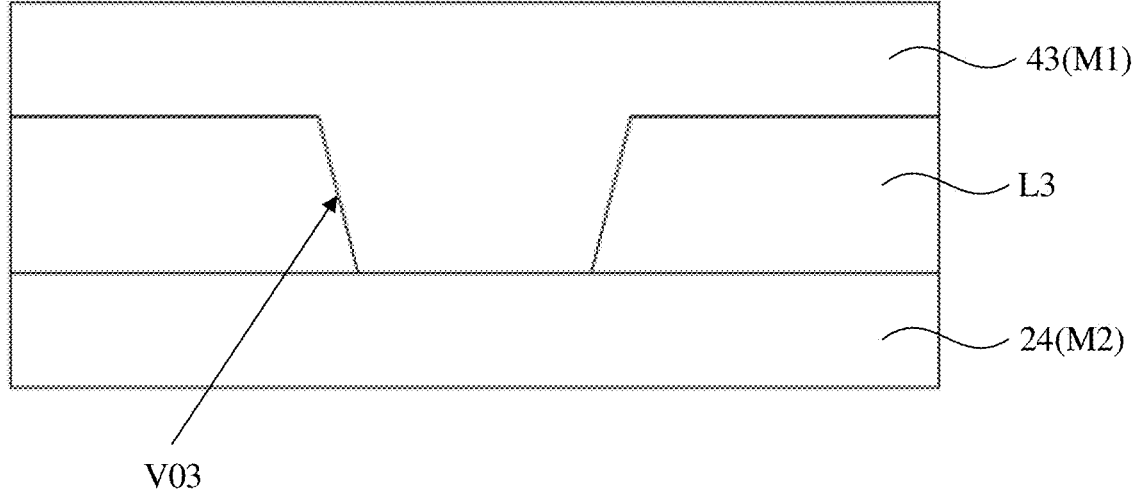
FIG. 6A schematically shows a cross-sectional view of electrically connected shielding portion and first power signal line in a display substrate according to some embodiments of the present disclosure.

FIG. 6A schematically shows a cross-sectional view of electrically connected shielding portion and first power signal line in a display substrate according to some embodiments of the present disclosure.

According to some exemplary embodiments, the display substrate includes a first power signal line used to transmit the first power signal, and the shielding portion is electrically connected to the first power signal line, so that the shielding portion receives the first power signal. For example, referring to FIG. 6A, the first power signal line 43 is arranged in the first conductive layer M1, the shielding portion 24 is arranged in the second conductive layer M2, and a third insulation layer L3 is provided between the first conductive layer M1 and the second conductive layer M2. A third via hole V03 is provided in the third insulation layer L3, the third via hole V03 exposes at least part of the shielding portion 24, and the shielding portion 24 is electrically connected to the first power signal line 43 through the third via hole V03.

According to some exemplary embodiments, referring to FIG. 2, the plurality of transistors further include a fifth transistor T5. A first electrode of the fifth transistor T5 is used to receive a reference voltage signal Vref, and a second electrode of the fifth transistor T5 is electrically connected to the second electrode of the first transistor T1. The shielding portion is used to receive the reference voltage signal Vref.

Figure 6B:
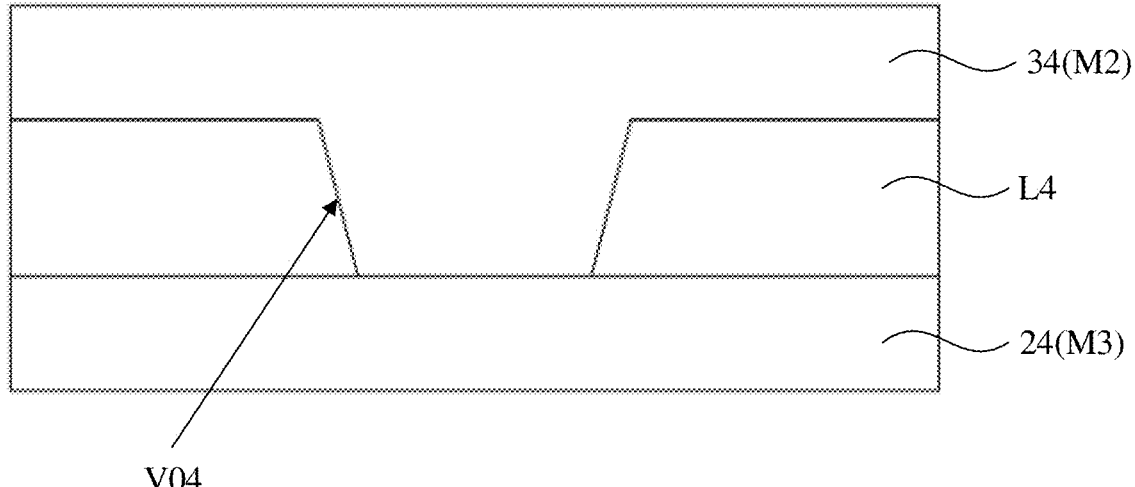
FIG. 6B schematically shows a cross-sectional view of electrically connected shielding portion and reference voltage signal line in a display substrate according to some embodiments of the present disclosure.

FIG. 6B schematically shows a cross-sectional view of electrically connected shielding portion and reference voltage signal line in a display substrate according to some embodiments of the present disclosure.

According to some exemplary embodiments, the display substrate includes a reference voltage signal line used to transmit the reference voltage signal, and the shielding portion is electrically connected to the reference voltage signal line, so that the shielding portion receives the reference voltage signal. For example, referring to FIG. 6B, the reference voltage signal line 34 is arranged in the second conductive layer M2, the shielding portion 24 is arranged in the third conductive layer M3, and a fourth insulation layer L4 is provided between the third conductive layer M3 and the second conductive layer M2. A fourth via hole V04 is provided in the fourth insulation layer L4, the fourth via hole V04 exposes at least part of the shielding portion 24, and the shielding portion 24 is electrically connected to the reference voltage signal line 34 through the fourth via hole V04.

According to some exemplary embodiments, referring to FIG. 2, the plurality of transistors further include an eighth transistor T8. A first electrode of the eighth transistor T8 is used to receive a second initialization signal Vinit2, and a second electrode of the eighth transistor T8 is electrically connected to the first electrode of the light-emitting element. The shielding portion is used to receive the second initialization signal Vinit2.

Figure 6C:
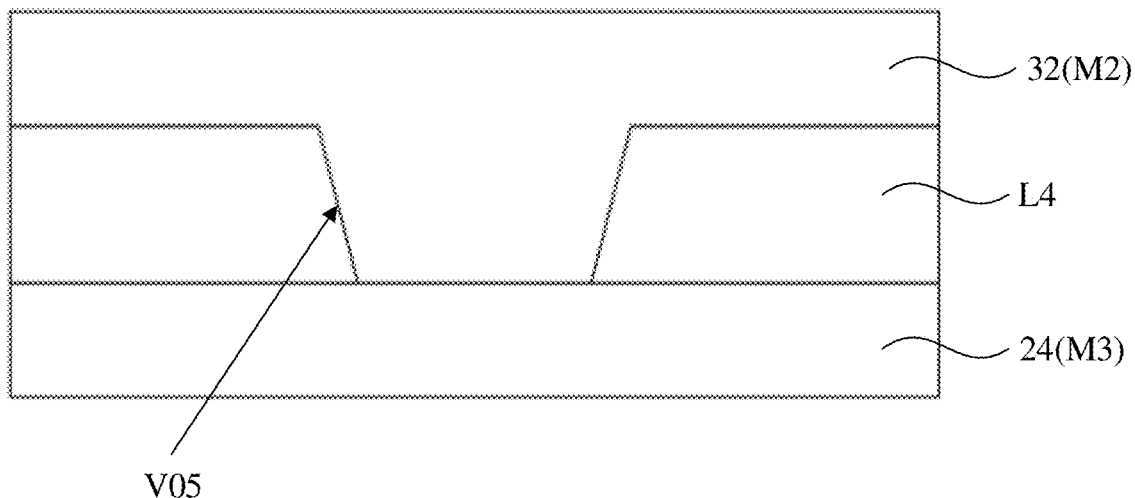
FIG. 6C schematically shows a cross-sectional view of electrically connected shielding portion and second initialization signal line in a display substrate according to some embodiments of the present disclosure.

FIG. 6C schematically shows a cross-sectional view of electrically connected shielding portion and second initialization signal line in a display substrate according to some embodiments of the present disclosure.

According to some exemplary embodiments, the display substrate includes a second initialization signal line, the second initialization signal line is used to transmit the second initialization signal, and the shielding portion is electrically connected to the second initialization signal line, so that the shielding portion receives the second initialization signal. For example, referring to FIG. 6C, the second initialization signal line 32 is arranged in the second conductive layer M2, the shielding portion 24 is arranged in the third conductive layer M3, and a fourth insulation layer L4 is provided between the third conductive layer M3 and the second conductive layer M2. A fifth via hole V05 is provided in the fourth insulation layer L4, and the fifth via hole V05 exposes at least part of the shielding portion 24, and the shielding portion 24 is electrically connected to the second initialization signal line 32 through the fifth via hole V05.

According to some exemplary embodiments, referring to FIG. 4A and FIG. 5A, the display substrate further includes a scanning signal line 35 in the second conductive layer, and the scanning signal line 35 is electrically connected to the first conductive portion 11 arranged in the fourth conductive layer. That is, the scanning signal line 35 is electrically connected to the gate of the first transistor and the gate of the second transistor, and the scanning signal line 35 is used to provide the scanning signal to the gate of the first transistor and the gate of the second transistor. The orthographic projection of the shielding portion 24 on the base substrate is spaced apart from an orthographic projection of the scanning signal line 35 on the base substrate. The orthographic projection of the shielding portion 24 on the base substrate is spaced apart from the orthographic projection of the gate of the second transistor on the base substrate, that is, the orthographic projection of the shielding portion 24 on the base substrate is spaced apart from the orthographic projection of the first conductive portion 11 on the base substrate. As the shielding portion 24 is spaced apart from the first conductive portion 11 and the scanning signal line 35, the signal transmitted in the shielding portion 24 is prevented from interfering with the scanning signal transmitted in the first conductive portion 11 and the scanning signal line 35.

According to some exemplary embodiments, the display substrate includes a light shielding layer between the active layer and the base substrate, a plurality of active portions of the plurality of transistors are arranged in the active layer, and an orthographic projection of the light shielding layer on the base substrate at least partially overlaps with orthographic projections of the plurality of active portions on the base substrate.

According to some exemplary embodiments, referring to FIG. 2 and FIG. 3, the plurality of transistors further include a fourth transistor T4, a fifth transistor T5, a sixth transistor T6, a seventh transistor T7, and an eighth transistor T8. The first electrode S4 of the fourth transistor T4 is used to receive the first initialization signal Vinit1, and the second electrode D4 of the fourth transistor T4 is electrically connected to the gate of the third transistor T3. The first electrode S5 of the fifth transistor T5 is used to receive to the reference voltage signal Vref, and the second electrode D5 of the fifth transistor T5 is electrically connected to the second electrode D1 of the first transistor T1. A first electrode S6 of the sixth transistor T6 is used to receive the reference voltage signal Vref, and a second electrode D6 of the sixth transistor T6 is electrically connected to the second electrode D1 of the first transistor T1. A first electrode S7 of the seventh transistor T7 is electrically connected to the second electrode D3 of the third transistor T3, and a second electrode D7 of the seventh transistor T7 is electrically connected to the first electrode of the light-emitting element. A first electrode S8 of the eighth transistor T8 is used to receive the second initialization signal Vinit2, and a second electrode D8 of the eighth transistor T8 is electrically connected to the first electrode of the light-emitting element. Each of the gate of the first transistor T1 and the gate of the second transistor T2 is used to receive the scanning signal Gate, each of a gate of the fourth transistor T4, a gate of the fifth transistor T5 and a gate of the eighth transistor T8 is used to receive the reset signal Reset, and each of a gate of the sixth transistor T6 and a gate of the seventh transistor T7 is used to receive the light-emitting control signal EM.

Referring to FIG. 3, an active portion of the fourth transistor T4 includes a channel portion CH4, and the first electrode S4 and the second electrode D4 respectively connected to the channel portion CH4 on opposite sides of the channel portion CH4. The fourth transistor T4 is a dual-gate dual-channel transistor. The channel portion CH4 of the fourth transistor T4 includes a first sub-channel portion CH41 and a second sub-channel portion CH42 that are spaced apart from each other. The first sub-channel portion CH41 is connected to the second sub-channel portion CH42 through a channel connection portion CH43. An active portion of the fifth transistor T5 includes a channel portion CH5, and the first electrode S5 and the second electrode D5 respectively connected to the channel portion CH5 on opposite sides of the channel portion CH5. An active portion of the sixth transistor T6 includes a channel portion CH6, and the first electrode S6 and the second electrode D6 respectively connected to the channel portion CH6 on opposite sides of the channel portion CH6. An active portion of the seventh transistor T7 includes a channel portion CH7, and the first electrode S7 and the second electrode D7 respectively connected to the channel portion CH7 on opposite sides of the channel portion CH7. An active portion of the eighth transistor T8 includes a channel portion CH8, and the first electrode S8 and the second electrode D8 respectively connected to the channel portion CH8 on opposite sides of the channel portion CH8.

Figure 7:
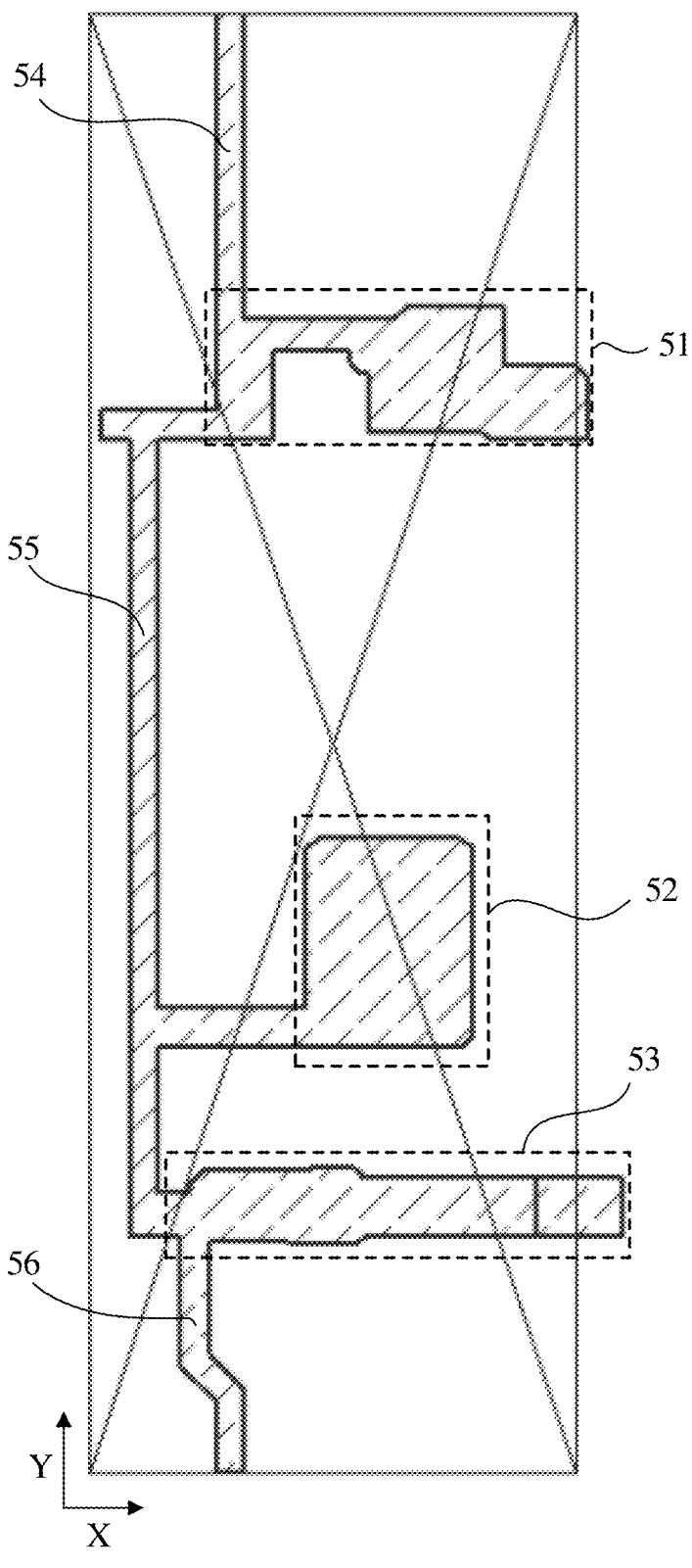
FIG. 7 schematically shows a plan view of a light shielding layer in a display substrate according to some embodiments of the present disclosure.
Figure 8:
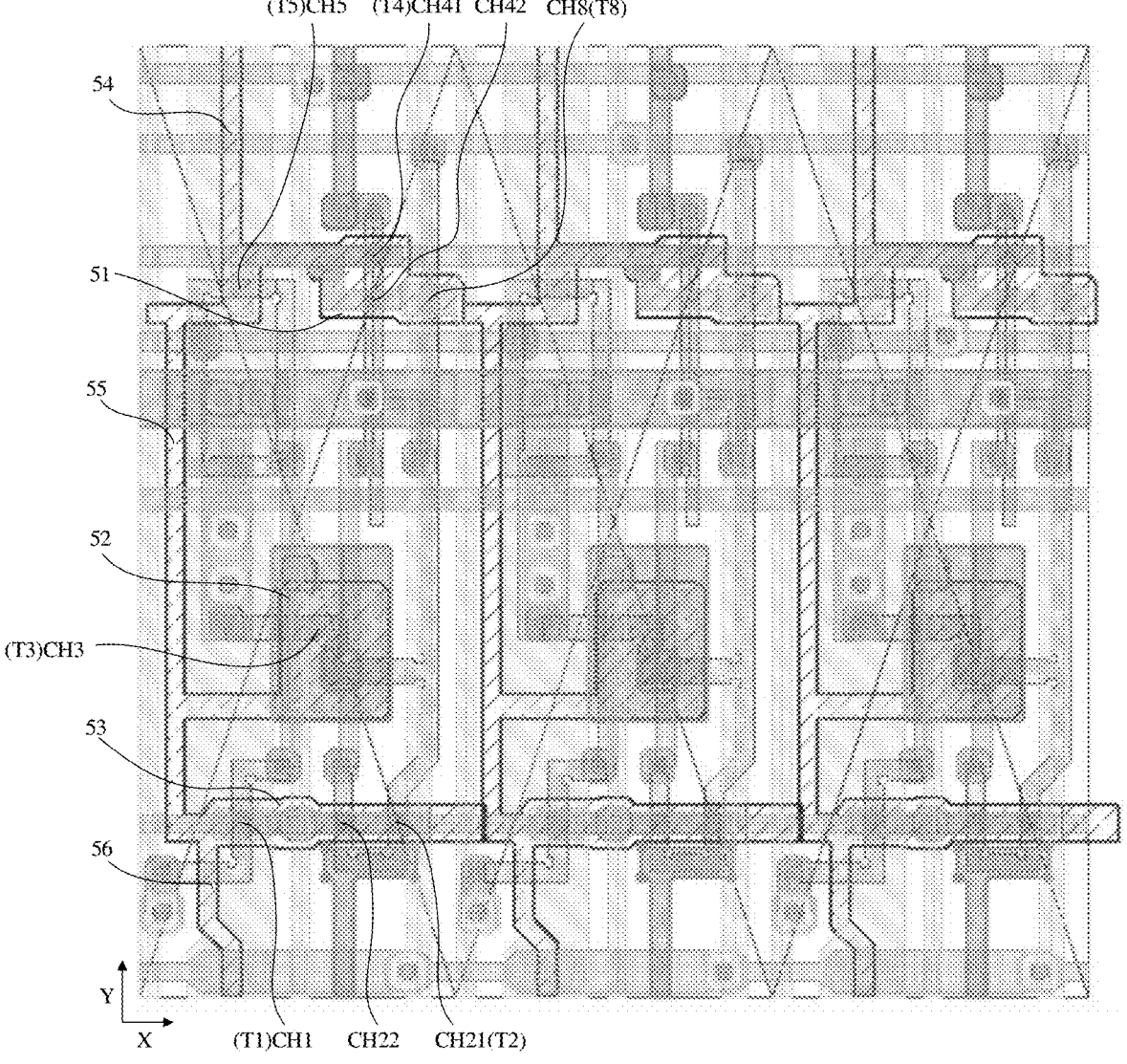
FIG. 8 schematically shows a plan view of a combination of a light shielding layer, an active layer, a fourth conductive layer, a third conductive layer, a second conductive layer and a first conductive layer in a display substrate according to some embodiments of the present disclosure.

FIG. 7 schematically shows a plan view of a light shielding layer in a display substrate according to some embodiments of the present disclosure. FIG. 8 schematically shows a plan view of a combination of a light shielding layer, an active layer, a fourth conductive layer, a third conductive layer, a second conductive layer and a first conductive layer in a display substrate according to some embodiments of the present disclosure. In order to clearly show connections of patterns of the light shielding layer in adjacent sub-pixels, FIG. 8 schematically shows a plan view of a region in which three adjacent driving circuits in the first direction are located.

Referring to FIG. 3 and FIG. 8, the orthographic projection of the light shielding layer on the base substrate at least partially overlaps with an orthographic projection of each of the active portion of the first transistor T1, the active portion of the second transistor T2, the active portion of the third transistor T3, the active portion of the fourth transistor T4, the active portion of the fifth transistor T5 and the active portion of the eighth transistor T8 on the base substrate.

Referring to FIG. 7, the light shielding layer includes a first light shielding portion 51, a second light shielding portion 52, a third light shielding portion 53, a first connection segment 54, a second connection segment 55, and a third connection segment 56. The first connection segment 54 is a straight connection segment extending in the second direction Y, the second connection segment 55 is a straight connection segment extending in the second direction Y, and the third connection segment 56 is a zigzag connection segment extending in the second direction Y. The first light shielding portion 51 is connected between the first connection segment 54 and the second connection segment 55, the second light shielding portion 52 is arranged on a side of the second connection segment 55 in the first direction X and connected to the second connection segment 55, and the third light shielding portion 53 is connected between the second connection segment 55 and the third connection segment 56.

Referring to FIG. 7 and FIG. 8, an orthographic projection of the first light shielding portion 51 on the base substrate covers an orthographic projection of the channel portion CH5 of the fifth transistor T5 on the base substrate, the orthographic projection of the first light shielding portion 51 on the base substrate covers orthographic projections of the first sub-channel portion CH41 and the second sub-channel portion CH42 of the fourth transistor T4 on the base substrate, and the orthographic projection of the first light shielding portion 51 on the base substrate covers an orthographic projection of the channel portion CH8 of the eighth transistor T8 on the base substrate. An orthographic projection of the second light shielding portion 52 on the base substrate covers an orthographic projection of the channel portion CH3 of the third transistor T3 on the base substrate. An orthographic projection of the third light shielding portion 53 on the base substrate covers an orthographic projection of the channel portion CH1 of the first transistor T1 on the base substrate, and the orthographic projection of the third light shielding portion 53 on the base substrate covers an orthographic projection of the channel portion CH2 of the second transistor T2 on the base substrate.

By using the light shielding layer to shield the channel portion of the first transistor T1, the channel portion of the second transistor T2, the channel portion of the third transistor T3, the channel portion of the fourth transistor T4, the channel portion of the fifth transistor T5 and the channel portion of the eighth transistor T8 from their bottom sides, the hysteresis effect of the third transistor serving as a driving transistor is reduced, and thus the driving performance of the driving circuit may be more stable.

According to some exemplary embodiments, referring to FIG. 8, in different sub-pixels, patterns of the light shielding layer are interconnected to form as an integral structure, that is, the light shielding layer has a grid-like structure. In an example, with reference to FIG. 7 and FIG. 8, for two patterns of the light shielding layer in two sub-pixels adjacent in the first direction X, the first shielding portion 51 in one of the two patterns of the light shielding layer is directly connected to the second connection segment 55 in the other of the two patterns of the light shielding layer, and the third shielding portion 53 in one of the two patterns of the light shielding layer is directly connected to the second connection segment 55 in the other of the two patterns of the light shielding layer. For two patterns of the light shielding layer in two sub-pixels adjacent in the second direction Y, the third connection segment 56 in one of the two patterns of the light shielding layer is directly connected to the first connection segment 54 in the other of the two patterns of the light shielding layer.

According to some exemplary embodiments, the light shielding layer is used to receive a constant voltage signal. In an example, the light shielding layer may be used to receive the first power signal.

According to some exemplary embodiments, the display substrate includes a first power signal transmission structure used to transmit the first power signal, and the light shielding layer is electrically connected to the first power signal transmission structure in the display region. The light shielding layer having the grid-like structure is electrically connected to the first power signal transmission structure, which may effectively improve the uniformity of distribution of the first power signal in the display region, thereby improving the display uniformity.

Figure 9:
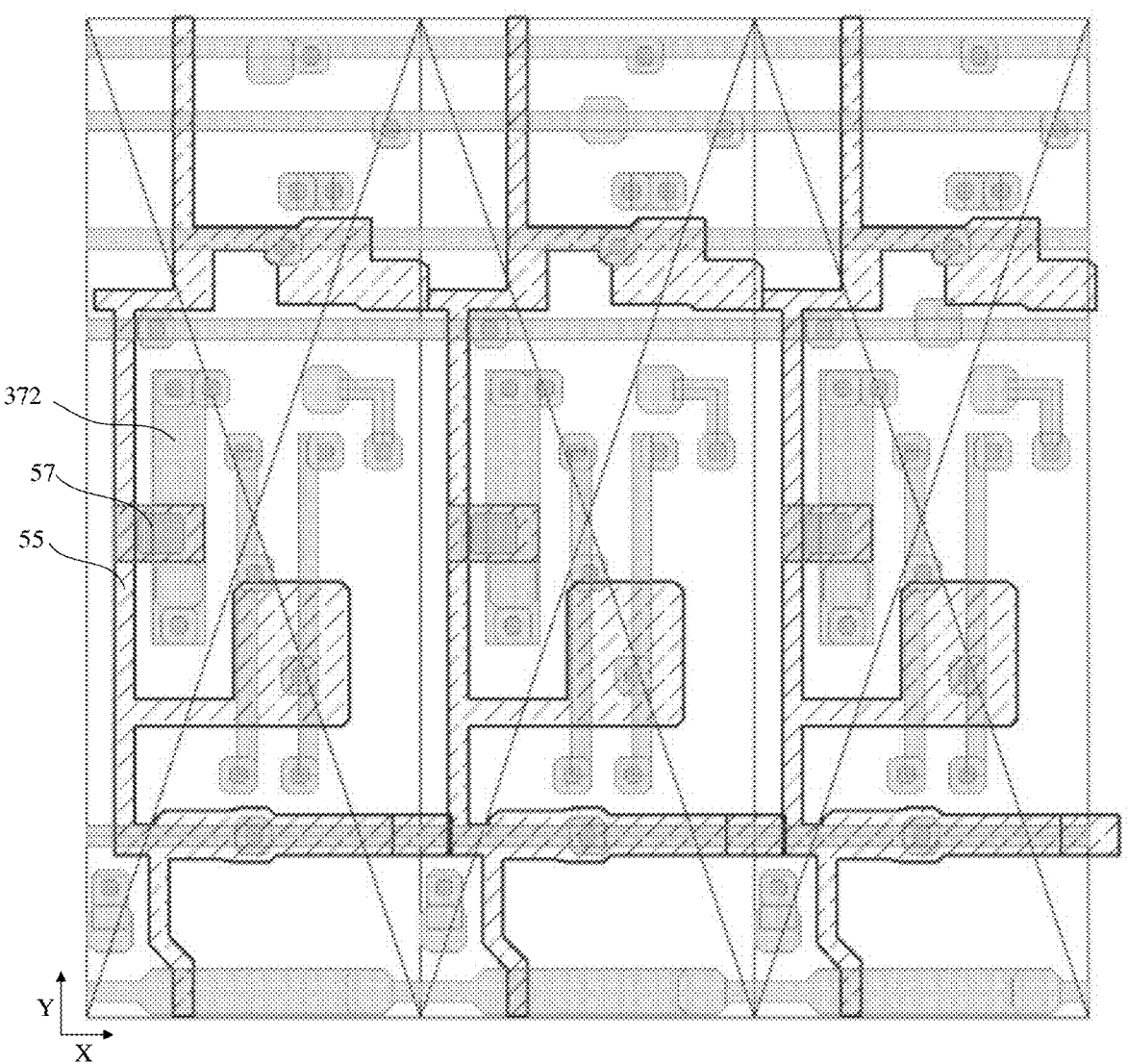
FIG. 9 schematically shows a plan view of a combination of a light shielding layer and a second conductive layer in a display substrate according to some embodiments of the present disclosure.
Figure 10:
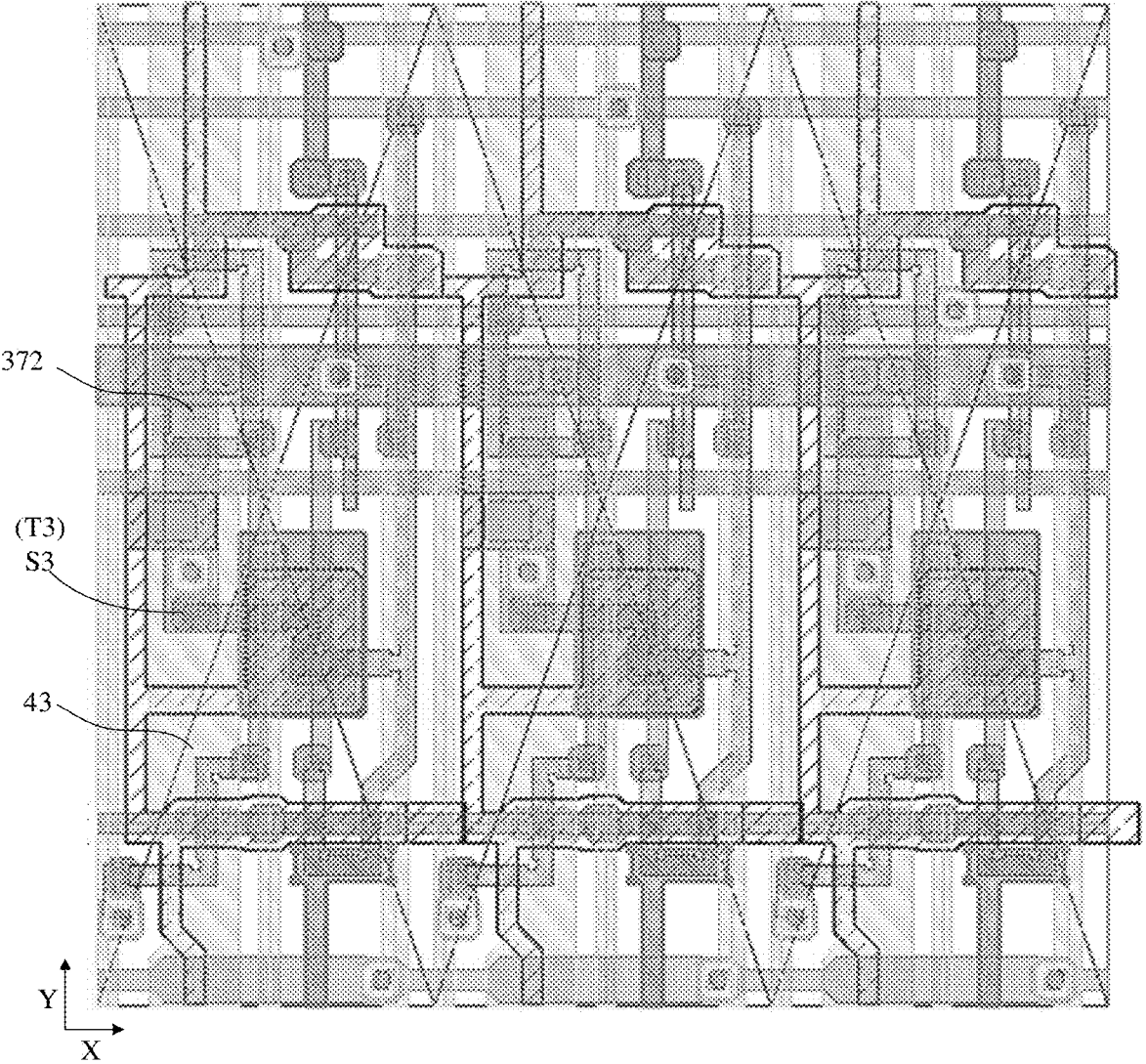
FIG. 10 schematically shows a plan view of a combination of a light shielding layer, an active layer, a fourth conductive layer, a third conductive layer, a second conductive layer and a first conductive layer in a display substrate according to some embodiments of the present disclosure.

FIG. 9 schematically shows a plan view of a combination of a light shielding layer and a second conductive layer in a display substrate according to some embodiments of the present disclosure. FIG. 10 schematically shows a plan view of a combination of a light shielding layer, an active layer, a fourth conductive layer, a third conductive layer, a second conductive layer and a first conductive layer in a display substrate according to some embodiments of the present disclosure.

According to some exemplary embodiments, referring to FIG. 10, the first power signal transmission structure includes a plurality of first power signal lines 43 in the first conductive layer and a plurality of first power signal connection portions 372 in the second conductive layer, and the plurality of first power signal lines 43 are arranged in the first direction X and extend in the second direction Y. The first power signal connection portion 372 is electrically connected to the first power signal line 43, and the first power signal connection portion 372 is electrically connected to the first electrode S3 of the third transistor T3.

Referring to FIG. 9, the light shielding layer is further provided with a first connection portion 57. The first connection portion 57 and the second connection segment 55 are connected to form an integral structure. The orthographic projection of the first connection portion 57 on the base substrate partially overlaps with the orthographic projection of the first power signal connection portion 372 on the base substrate, and in the overlapping region, the first connection portion 57 is electrically connected to the first power signal connection portion 372.

For example, the light shielding layer includes a plurality of first connection portions 57 respectively arranged in the plurality of sub-pixels, and the plurality of first connection portions 57 are electrically connected to the plurality of first power signal connection portions 372, respectively. That is, the light shielding layer is electrically connected to the first power signal transmission structure in each of the plurality of sub-pixels. In this way, the wires of different sub-pixels in the display substrate are evenly distributed, thereby improving the display uniformity of the display substrate.

According to some exemplary embodiments, referring to FIG. 2, the first electrode of the fifth transistor T5 receives the reference voltage signal Vref, and the light shielding layer may be used to receive the reference voltage signal Vref.

Figure 11:
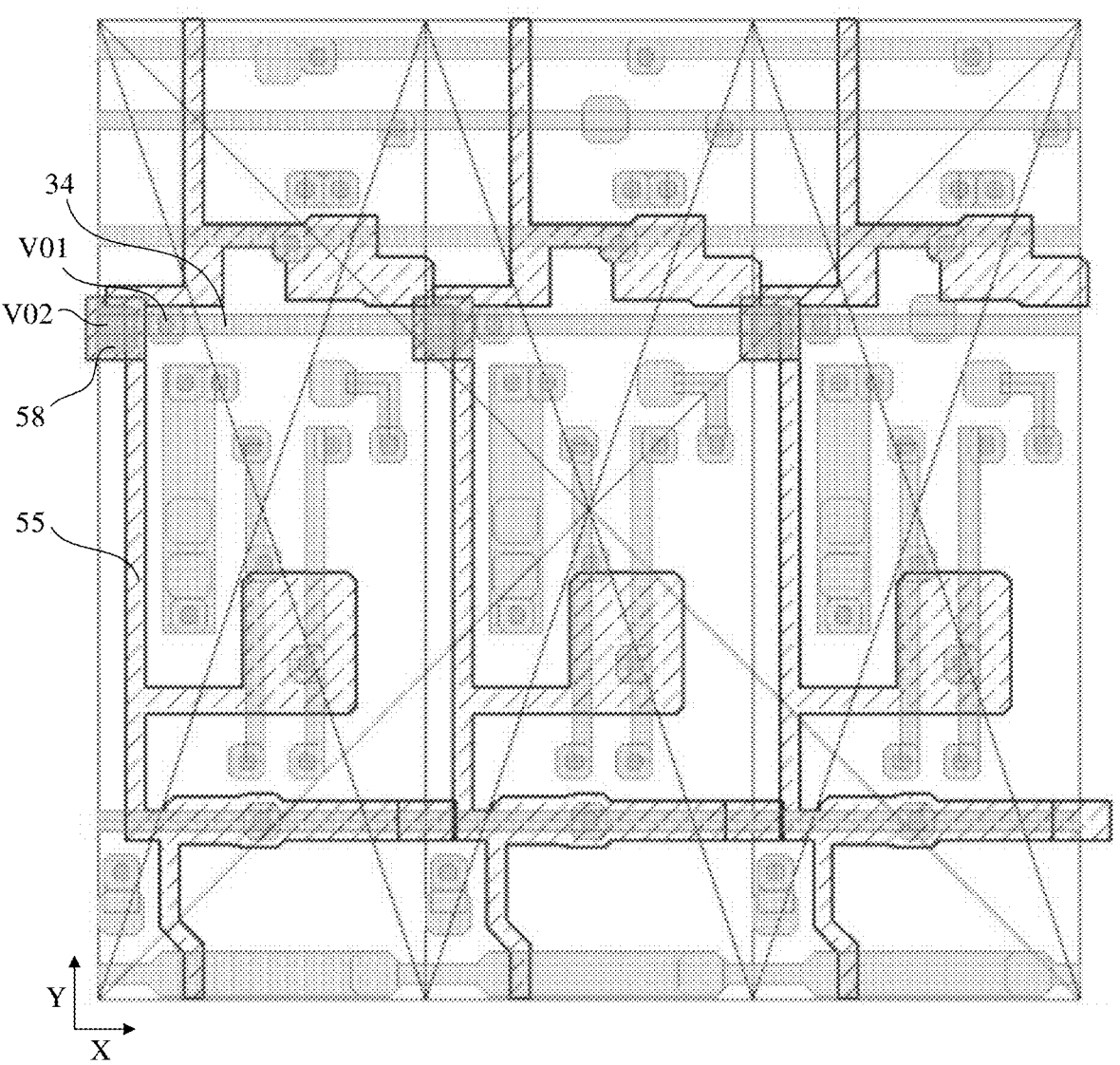
FIG. 11 schematically shows a plan view of a combination of a light shielding layer and a second conductive layer in a display substrate according to some embodiments of the present disclosure.
Figure 12:
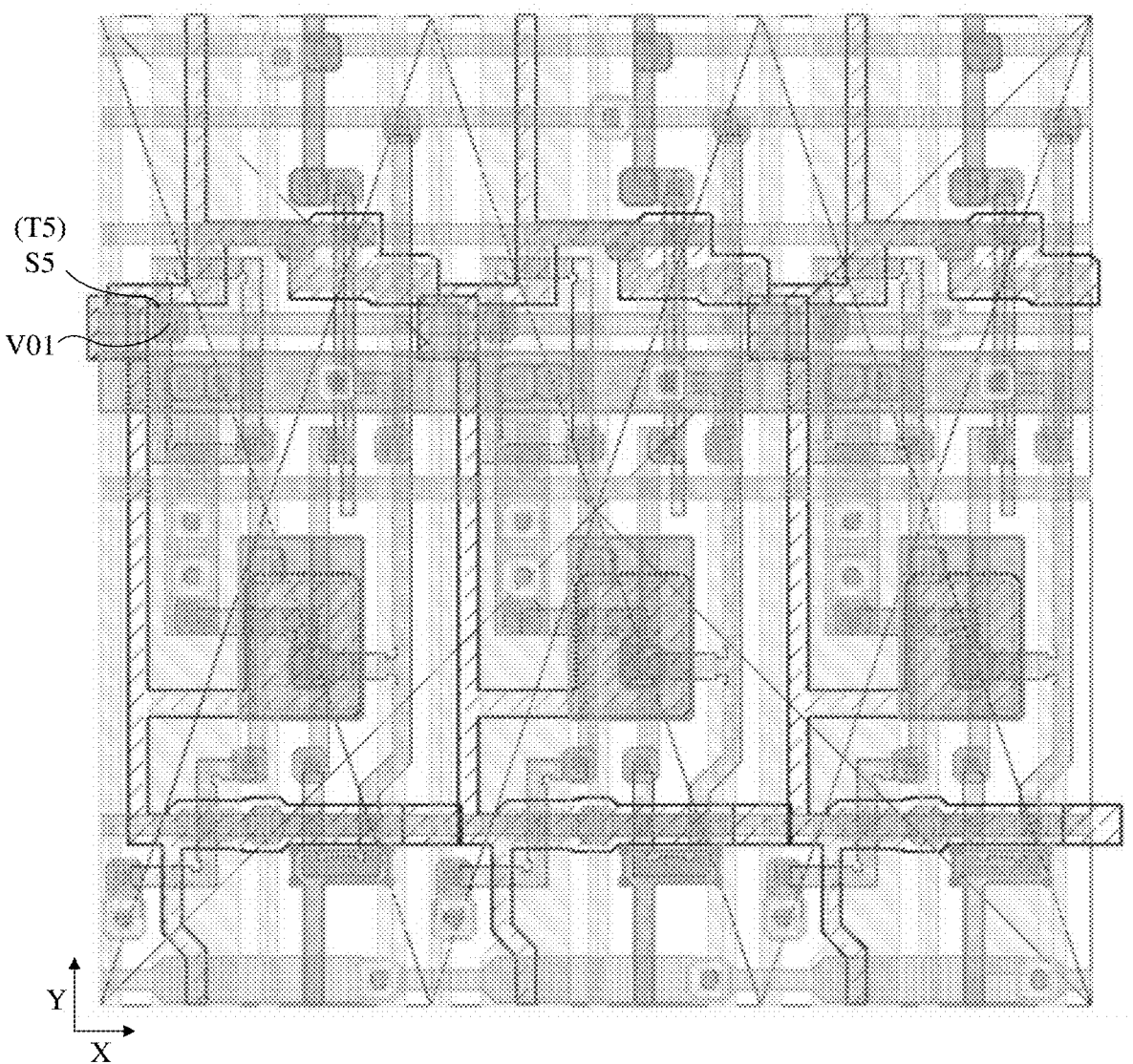
FIG. 12 schematically shows a plan view of a combination of a light shielding layer, an active layer, a fourth conductive layer, a third conductive layer, a second conductive layer and a first conductive layer in a display substrate according to some embodiments of the present disclosure.

FIG. 11 schematically shows a plan view of a combination of a light shielding layer and a second conductive layer in a display substrate according to some embodiments of the present disclosure. FIG. 12 schematically shows a plan view of a combination of a light shielding layer, an active layer, a fourth conductive layer, a third conductive layer, a second conductive layer and a first conductive layer in a display substrate according to some embodiments of the present disclosure.

According to some exemplary embodiments, referring to FIG. 11 and FIG. 12, the display substrate includes a reference voltage signal line 34 used to transmit the reference voltage signal. For example, the reference voltage signal line may be arranged in the second conductive layer.

The display substrate further includes a first insulation layer between the light shielding layer and the active layer and a second insulation layer between the active layer and the second conductive layer. The second insulation layer includes a first via hole V01, the first insulation layer and the second insulation layer include a second via hole V02, the first via hole V01 exposes at least part of the first electrode S5 of the fifth transistor T5, and the second via hole V02 exposes at least part of the light shielding layer. The reference voltage signal line 34 is electrically connected to the first electrode S5 of the fifth transistor T5 through the first via hole V01. The reference voltage signal line 34 is electrically connected to the light shielding layer through the second via hole V02, and an orthographic projection of the second via hole V02 on the base substrate is adjacent to and spaced apart from an orthographic projection of the first via hole V01 on the base substrate.

It should be noted that, the orthographic projection of the second via hole V02 on the base substrate being adjacent to and spaced apart from the orthographic projection of the first via hole V01 on the base substrate may refer to that: the orthographic projection of the second via hole V02 on the base substrate does not overlap with the orthographic projection of the first via hole V01 on the base substrate, and the distance between the orthographic projection of the second via hole V02 on the base substrate and the orthographic projection of the first via hole V01 on the base substrate is less than a preset distance. For example, the distance between the orthographic projection of the second via hole V02 on the base substrate and the orthographic projection of the first via hole V01 on the base substrate is less than a size of the orthographic projection of the second via hole V02 on the base substrate in the first direction X, or the distance between the orthographic projection of the second via hole V02 on the base substrate and the orthographic projection of the first via hole V01 on the base substrate is less than a size of the orthographic projection of the first via hole V01 on the base substrate in the first direction X.

According to some exemplary embodiments, the light shielding layer includes a second connection portion 58, and the second connection portion 58 and the second connection segment 55 are connected to form an integral structure. An orthographic projection of the second connection portion 58 on the base substrate partially overlaps with an orthographic projection of the reference voltage signal line 34 on the base substrate, and in the overlapping region, the second connection portion 58 is electrically connected to the reference voltage signal line 34 through the second via hole V02.

For example, the light shielding layer includes a plurality of second connection portions 58 respectively arranged in the plurality of sub-pixels, and the plurality of second connection portions 58 are electrically connected to the plurality of reference voltage signal lines 34 through the plurality of second via holes V02, respectively. That is, the light shielding layer is electrically connected to the reference voltage signal line 34 in each of the plurality of sub-pixels. The light shielding layer having the grid-like structure is electrically connected to the plurality of reference voltage signal lines, which may effectively improve the uniformity of distribution of the reference voltage signal in the display region, thereby improving the display uniformity.

According to some exemplary embodiments, the light-emitting element layer includes a first electrode layer on a side of the driving circuit layer away from the base substrate, a pixel defining layer on a side of the first electrode layer away from the base substrate, a light-emitting function layer on a side of the pixel defining layer away from the base substrate, and a second electrode layer on a side of the light-emitting function layer away from the base substrate. The display substrate includes the second power signal transmission structure, and the second power signal transmission structure is arranged in the driving circuit layer and used to transmit the second power signal. The second power signal transmission structure includes at least one auxiliary electrode in the display region, the auxiliary electrode is electrically connected to the second electrode layer. By electrically connecting the second power signal transmission structure and the second electrode layer in the display region, a voltage drop (IR Drop) on the second power signal transmitted through the second electrode layer is effectively reduced, the uniformity of distribution of the second power signal over the second electrode layer may be improved, thereby improving the display uniformity.

Figure 13:
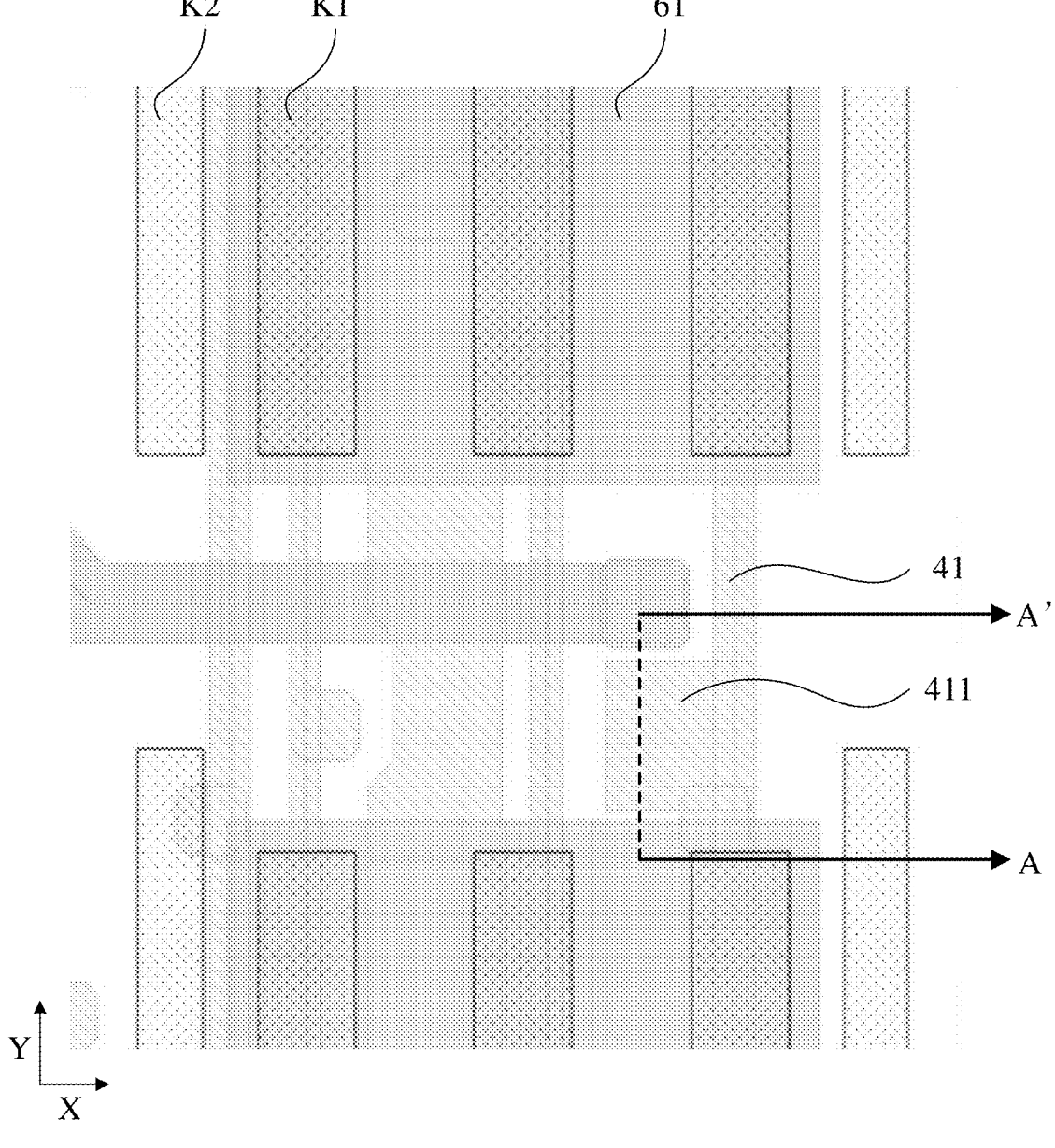
FIG. 13 schematically shows a plan view of a combination of a light shielding layer, a first conductive layer, a first electrode layer and a pixel defining layer in a display substrate according to some embodiments of the present disclosure.
Figure 14:
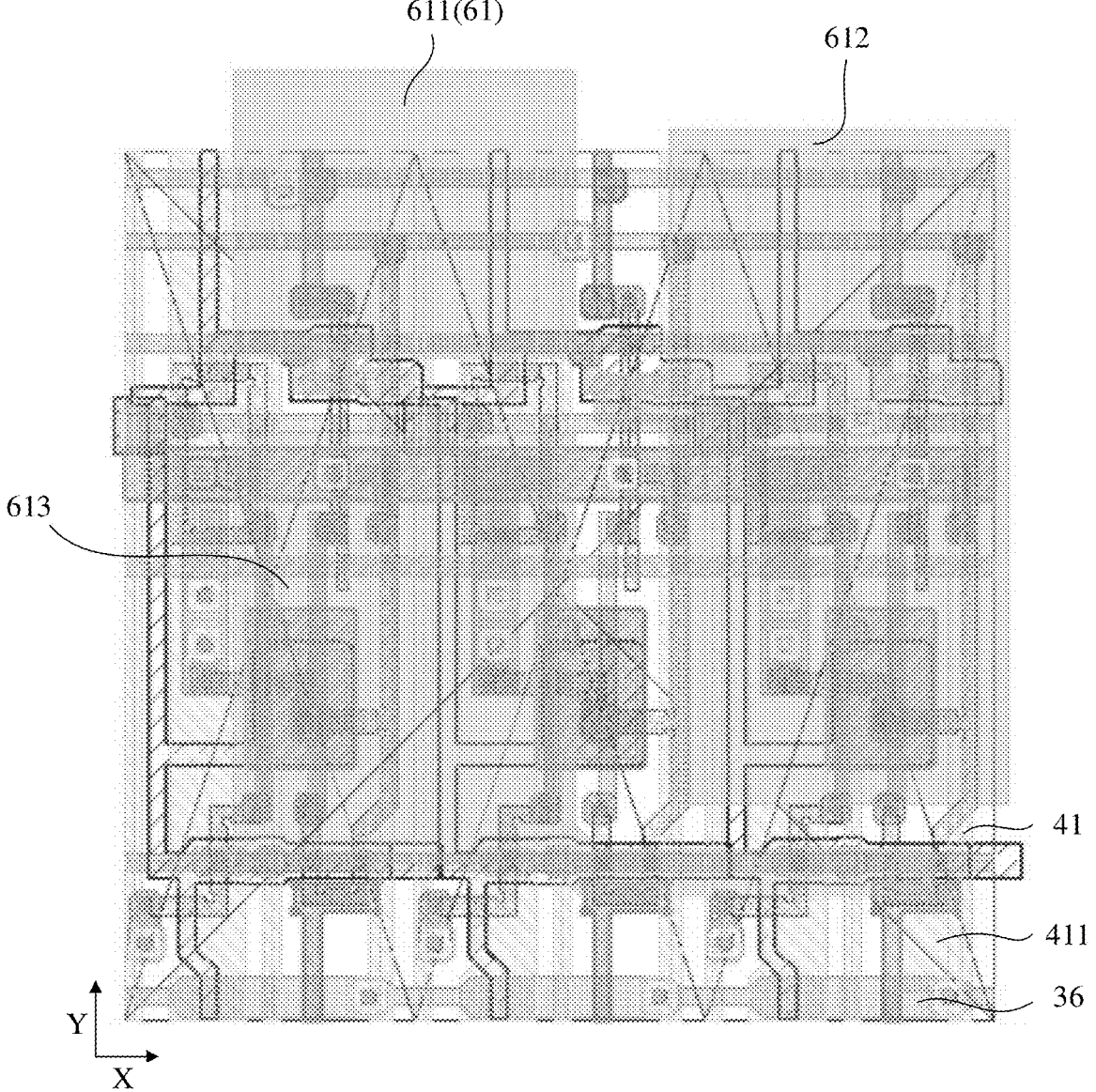
FIG. 14 schematically shows a plan view of a combination of a light shielding layer, an active layer, a fourth conductive layer, a third conductive layer, a second conductive layer, a first conductive layer and a first electrode layer in a display substrate according to some embodiments of the present disclosure.
Figure 15:
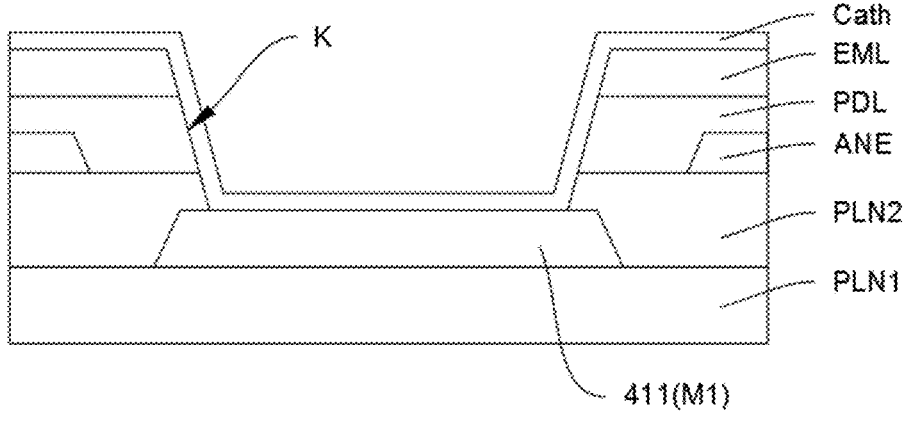
FIG. 15 schematically shows a cross-sectional view taken along line AA' in FIG. 13.

FIG. 13 schematically shows a plan view of a combination of a light shielding layer, a first conductive layer, a first electrode layer and a pixel defining layer in a display substrate according to some embodiments of the present disclosure. FIG. 14 schematically shows a plan view of a combination of a light shielding layer, an active layer, a fourth conductive layer, a third conductive layer, a second conductive layer, a first conductive layer and a first electrode layer in a display substrate according to some embodiments of the present disclosure. FIG. 15 schematically shows a cross-sectional view taken along line AA' in FIG. 13.

According to some exemplary embodiments, referring to FIG. 13 and FIG. 14, the second power signal transmission structure includes the second power signal line 41 and the second power grid line 36. The second power signal line 41 extends in the second direction Y and is arranged in the first conductive layer, the second power grid line 36 extends in the first direction X and is arranged in the second conductive layer, and the second power grid line 36 is electrically connected to the second power signal line 41. The auxiliary electrode 411 is arranged in the first conductive layer, and the auxiliary electrode 411 and the second power signal line 41 are connected to form an integral structure.

According to some exemplary embodiments, referring to FIG. 15, the auxiliary electrode 411 is arranged in the first conductive layer M1, a first planarization layer PLN1 is arranged on a side of the first conductive layer M1 facing the base substrate, a second planarization layer PLN2 is arranged on a side of the first conductive layer M1 away from the base substrate, a first electrode layer ANE is arranged on a side of the second planarization layer PLN2 away from the base substrate, a pixel defining layer PDL is arranged on a side of the first electrode layer ANE away from the base substrate, a light-emitting function layer EML is arranged on a side of the pixel defining layer PDL away from the base substrate, and a second electrode layer Cath is arranged on a side of the light-emitting function layer EML away from the base substrate. An orthographic projection of the auxiliary electrode 411 on the base substrate is spaced apart from an orthographic projection of the first electrode layer ANE on the base substrate. An opening K is provided in the second planarization layer PLN2, the pixel defining layer PDL and the light-emitting function layer EML. The opening K exposes at least part of the auxiliary electrode 411, and the second electrode layer Cath is electrically connected to the auxiliary electrode 411 through the opening K.

According to some exemplary embodiments, referring to FIG. 15, before the second electrode layer Cath is formed by evaporation, the opening K may be formed in the second planarization layer PLN2, the pixel definition layer PDL and the light-emitting function layer EML through a laser etching process, so that the subsequently formed second electrode layer Cath may be in contact with the auxiliary electrode 411 through the opening K. Referring to FIG. 13, the orthographic projection of the auxiliary electrode 411 on the base substrate may be in a shape of a rectangle, a size of the auxiliary electrode 411 in the first direction X is greater than or equal to 15 microns, and a size of the auxiliary electrode 411 in the second direction Y is greater than or equal to 15 microns.

According to some exemplary embodiments, referring to FIG. 13, the first electrode layer includes a plurality of first electrodes 61 arranged at intervals. The pixel definition layer includes a plurality of first openings K1 and a plurality of second openings K2. An orthographic projection of the first opening K1 on the base substrate falls within an orthographic projection of the first electrode 61 on the base substrate, and an orthographic projection of the second opening K2 on the base substrate is spaced apart from the orthographic projection of the first electrode 61 on the base substrate. At least one first opening K1 exposes a portion of the first electrode 61. For example, three first openings K1 expose a portion of the first electrode 61. The portion of the first electrode 61 exposed by the first opening K1 is used to contact the light-emitting function layer. The second opening K2 is arranged in an interval region between at least two first electrodes 61. For example, the cross section of the first opening K2 has an undercut structure, and a sidewall of the first opening K2 is used to interrupt a common function layer in the light-emitting function layer.

According to some exemplary embodiments, referring to FIG. 14, the plurality of first electrodes 61 include a first sub-electrode 611, a second sub-electrode 612, and a third sub-electrode 613. For example, the first sub-electrode 611 and the third sub-electrode 613 are arranged in the second direction Y, the first sub-electrode 611 and the second sub-electrode 612 are arranged in the first direction X, and the third sub-electrode 613 and the second sub-electrode 612 are arranged in the first direction X.

According to some exemplary embodiments, referring to FIG. 14, the orthographic projection of the auxiliary electrode 411 on the base substrate is located between orthographic projections of at least two first electrodes 61 on the base substrate. For example, the orthographic projection of the auxiliary electrode 411 on the base substrate is located between orthographic projections of two second sub-electrodes 612 adjacent in the second direction Y on the base substrate.

According to some exemplary embodiments, an arrangement density of the auxiliary electrodes in the display region may be set according to actual desires. For example, each sub-pixel is provided with one auxiliary electrode, or the plurality of sub-pixels are provided with one auxiliary electrode.

According to some exemplary embodiments, referring to FIG. 2, the pixel circuit has a 9T1C pixel circuit structure, and the pixel circuit includes one storage capacitor C1 and nine transistors T1 to T9. For example, all transistors are N-type transistors, the third transistor T3 is a driving transistor, and the other transistors are switching transistors.

Referring to FIG. 2, the first electrode of the first transistor T1 is used to receive the data signal Vdata, and the second electrode of the first transistor T1 is electrically connected to the second electrode plate of the first storage capacitor C1. The first electrode of the second transistor T2 is electrically connected to the second electrode of the third transistor T3, and the second electrode of the second transistor T2 is electrically connected to the gate of the third transistor T3. The first electrode of the third transistor T3 is used to receive the first power signal VDD, and the gate of the third transistor T3 is electrically connected to the first electrode plate of the storage capacitor C1. The first electrode of the fourth transistor T4 is used to receive the first initialization signal Vinit1, and the second electrode of the fourth transistor T4 is electrically connected to the gate of the third transistor T3. The first electrode of the fifth transistor T5 is used to receive the reference voltage signal Vref, and the second electrode of the fifth transistor T5 is electrically connected to the second electrode D1 of the first transistor T1. The first electrode of the sixth transistor T6 is used to receive the reference voltage signal Vref, and the second electrode of the sixth transistor T6 is electrically connected to the second electrode of the first transistor T1. The first electrode of the seventh transistor T7 is electrically connected to the second electrode of the third transistor T3, and the second electrode of the seventh transistor T7 is electrically connected to the first electrode of the light-emitting element. The first electrode of the eighth transistor T8 is used to receive the second initialization signal Vinit2, and the second electrode of the eighth transistor T8 is electrically connected to the first electrode of the light-emitting element. The first electrode of the ninth transistor T9 is electrically connected to the gate of the third transistor T3, and the second electrode of the ninth transistor T9 is floating.

Each of the gate of the first transistor T1 and the gate of the second transistor T2 is used to receive the scanning signal Gate. Each of the gate of the fourth transistor T4, the gate of the fifth transistor T5 and the gate of the eighth transistor T8 is used to receive the reset signal Reset. Each of the gate of the sixth transistor T6 and the gate of the seventh transistor T7 is used to receive the light-emitting control signal EM.

The gate of the third transistor T3, the first electrode plate of the storage capacitor, the second electrode of the second transistor T2 and the first electrode of the ninth transistor T9 are coupled to each other at a first node N1. The second electrode plate of the storage capacitor, the second electrode of the first transistor T1, the second electrode of the fifth transistor T5 and the second electrode of the sixth transistor T6 are coupled to each other at a second node N2. The second electrode of the seventh transistor T7, the second electrode D8 of the eighth transistor T8 and the first electrode of the light-emitting element are coupled to each other at a third node N3.

According to some exemplary embodiments, the process of driving the driving circuit includes three phases: a first phase, a second phase and a third phase, which are described below in conjunction with FIG. 2.

In the first phase, under the control of the reset signal Reset, the fourth transistor T4 is turned on, the first initialization signal Vinit1 initializes the first node N1, and the potential at the first node N1 at this point is the potential of the first initialization signal Vinit1; the fifth transistor T5 is turned on, and the reference voltage signal Vref is written into the second node N2; the eighth transistor T8 is turned on, residual charges in a previous display frame are released, and the second initialization signal Vinit2 is written into the third node N3, for example, the first electrode of the light-emitting element.

In the second phase, under the control of the scanning signal Gate, the first transistor T1 is turned on, and the data signal Vdata is written into the second node N2; the second transistor T2 is turned on, the diode connection of the third transistor T3 is sampled, the potential at the first node N1 is raised to (VDD+Vth), and the third transistor T3 gradually switches from a turned-on state to a turned-off state, so as to compensate a threshold voltage Vth of the driving transistor T3.

In the third phase, under the control of the light-emitting control signal EM, the sixth transistor T6 is turned on, and the reference voltage signal Vref is written into the second node N2; the ninth transistor T9 is turned on to reduce a leakage of the first node N1 in the light-emitting phase. As the potential at the second node N2 jumps, the potential at the second node N2 becomes (VDD+Vth+Vref−Vdata). While, the seventh transistor T7 is turned on, the driving current is output, and the light-emitting element emits light.

In embodiments of the present disclosure, under the driving of the driving circuit, a current of the light-emitting element meets the equation: $I=k(Vref-Vdata)^2$, where I is the value of the current used to drive the light-emitting element, k is a coefficient, Vref is the value of the reference voltage signal, and Vdata is the value of the data signal. According to the above current equation, the value of the current is not affected by the threshold voltage Vth of the transistor and the voltage VDD of the first power signal, that is, the compensation of Vth and VDD is achieved. Referring back to FIG. 11 and FIG. 12, in this embodiment, the light shielding layer having the grid-like structure is electrically connected to the plurality of reference voltage signal lines, which may improve the uniformity of the Vref signal, so that it is possible to ensure that the current I is less affected by a Vref difference. According to some exemplary embodiments, the display substrate includes a base substrate, and an active layer, a first gate insulation layer, a first gate metal layer, a second gate insulation layer, a second gate metal layer, an interlayer insulation layer, a first source and drain metal layer, a passivation layer, a first planarization layer, a second source and drain metal layer, a second planarization layer, a first electrode layer, a pixel defining layer, a light-emitting function layer and a second electrode layer that are sequentially arranged on the base substrate in a direction away from the base substrate. The active layer, the first gate insulation layer, the first gate metal layer, the second gate insulation layer, the second gate metal layer, the interlayer insulation layer, the first source and drain metal layer, the passivation layer, the first planarization layer and the second source and drain metal layer form the driving circuit layer. The first electrode layer, the pixel defining layer, the light-emitting function layer and the second electrode layer form the light-emitting element layer. The first gate metal layer serves as the fourth conductive layer in the aforementioned embodiments, the second gate metal layer serves as the third conductive layer in the aforementioned embodiments, the first source and drain metal layer serves as the second conductive layer in the aforementioned embodiments, and the second source and drain metal layer serves as the first conductive layer in the aforementioned embodiments.

FIG. 16A to FIG. 16H are plan views of some layers of a display substrate arranged in a display region according to some exemplary embodiments of the present disclosure.

Figure 16A:
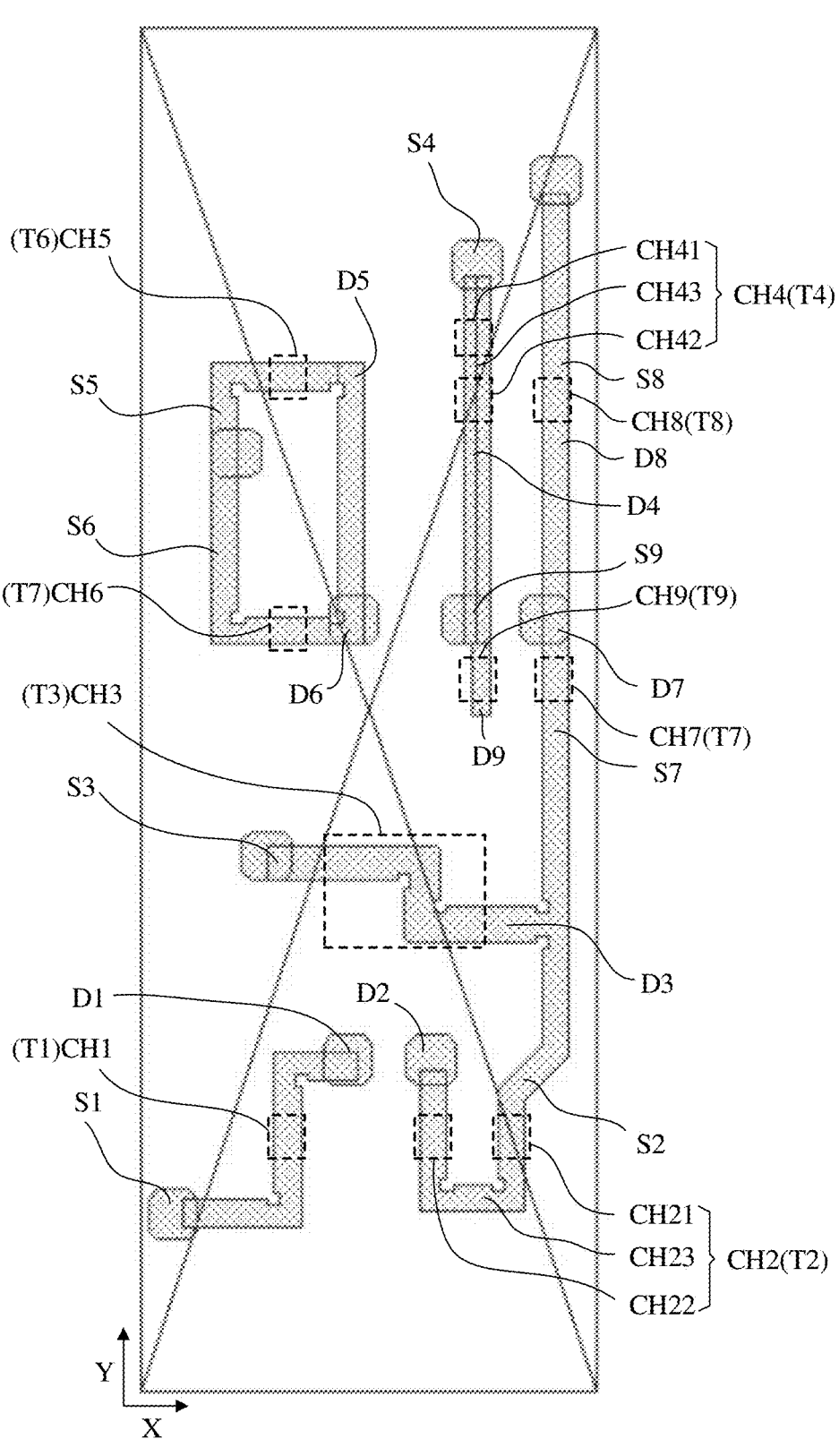
FIG. 16A to FIG. 16H are plan views of some film layers of a display substrate arranged in a display region according to some exemplary embodiments of the present disclosure, where
Figure 16B:
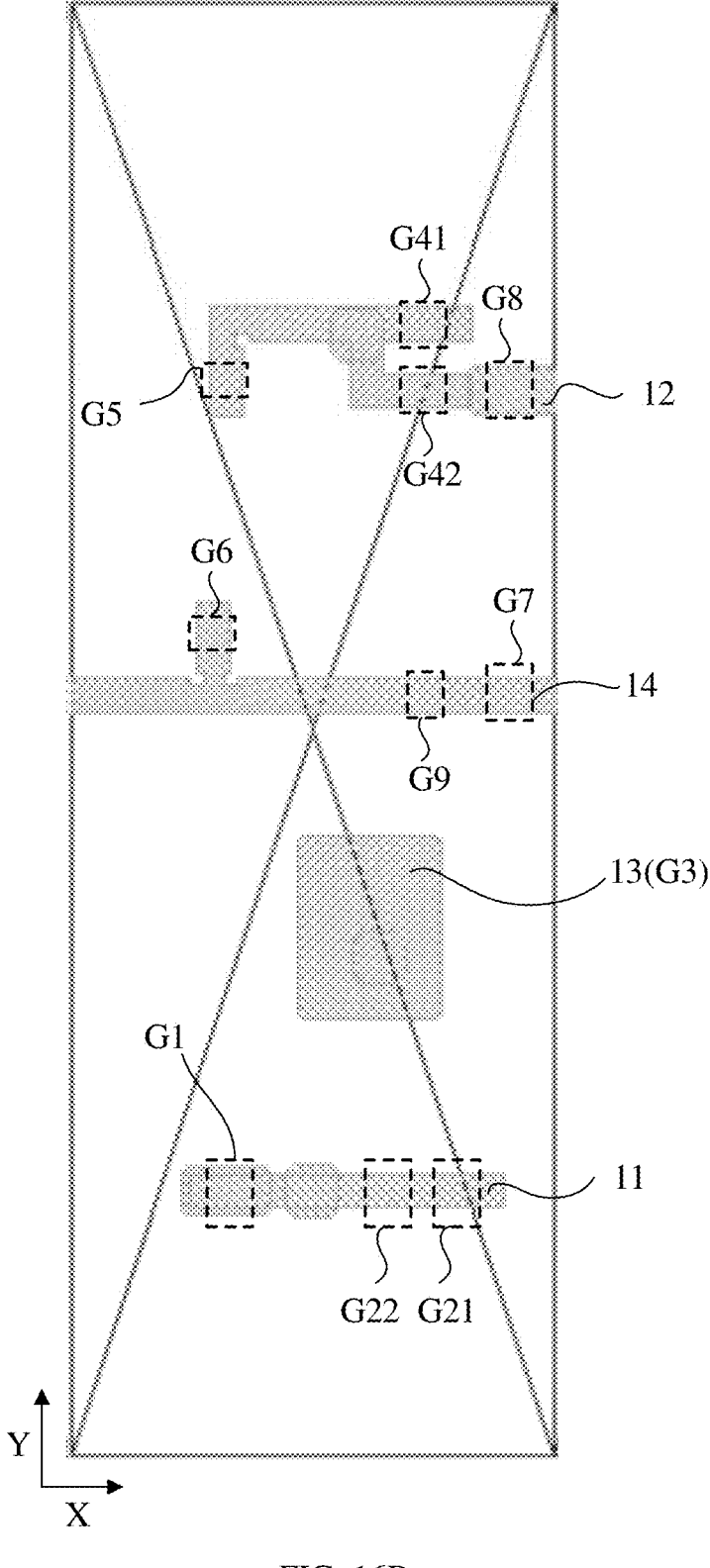
Figure 16C:
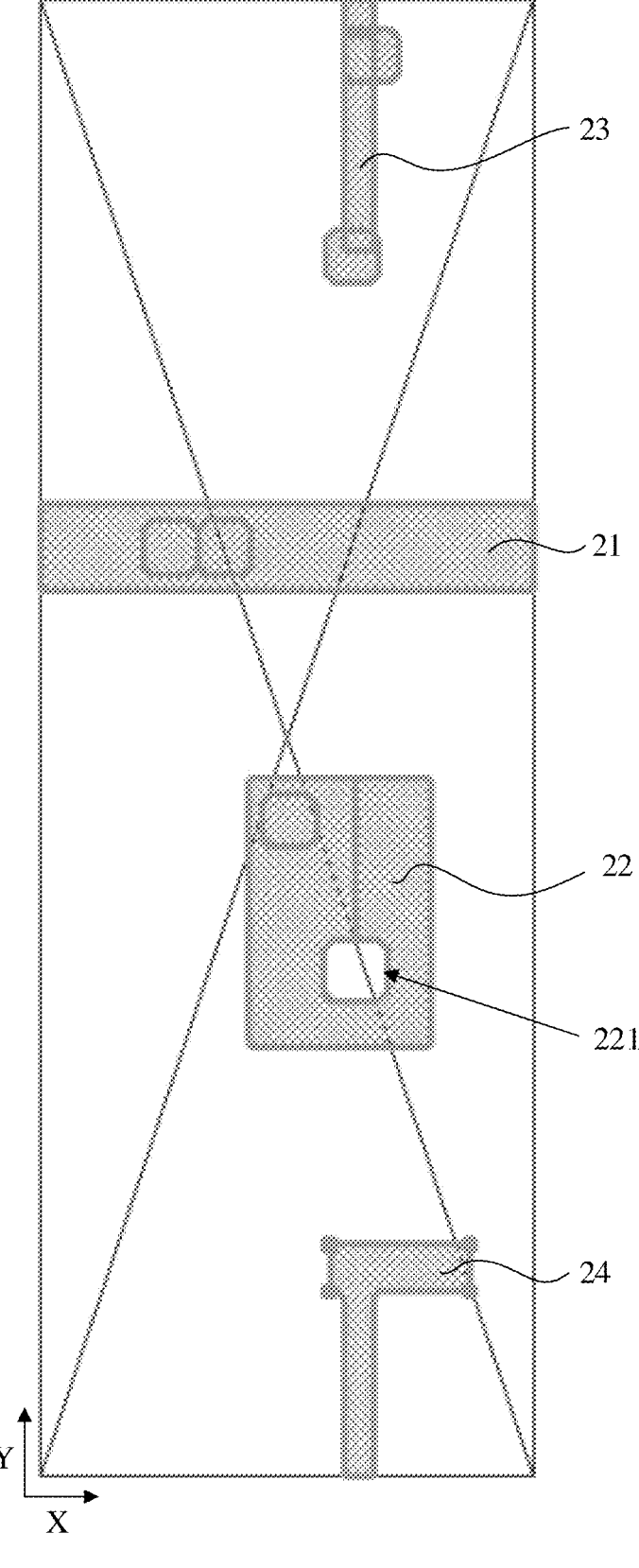
Figure 16D:
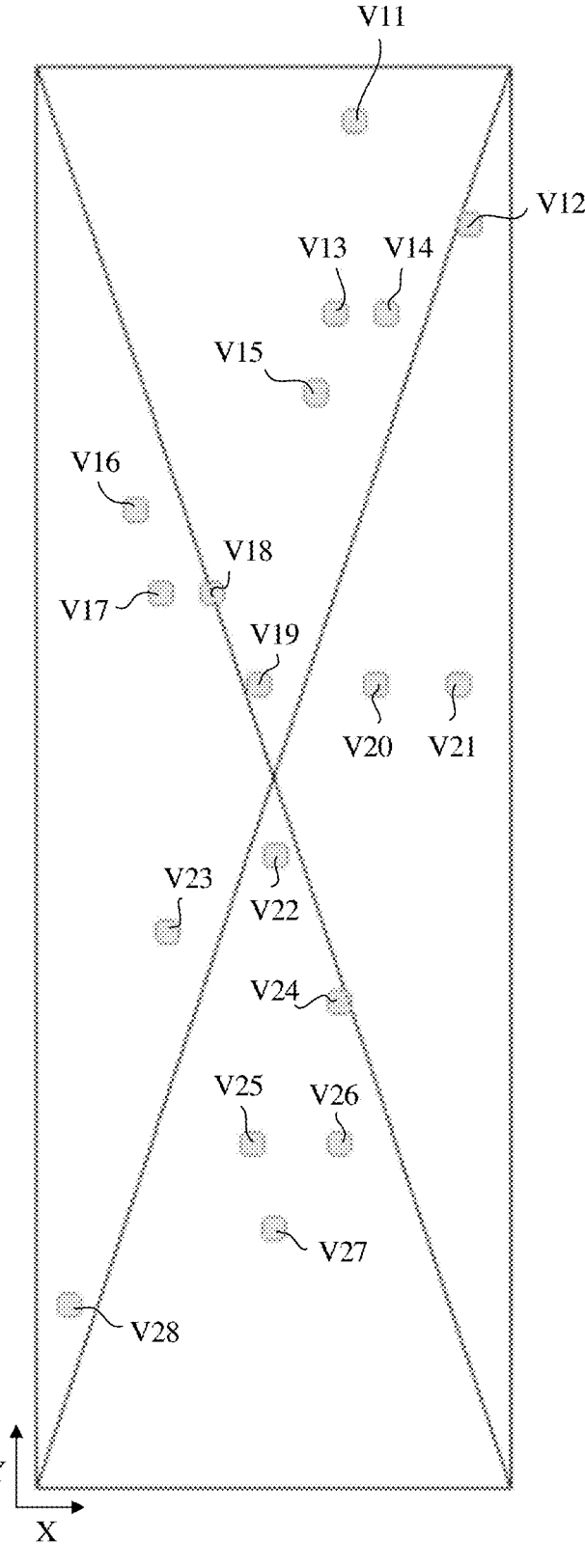
Figure 16E:
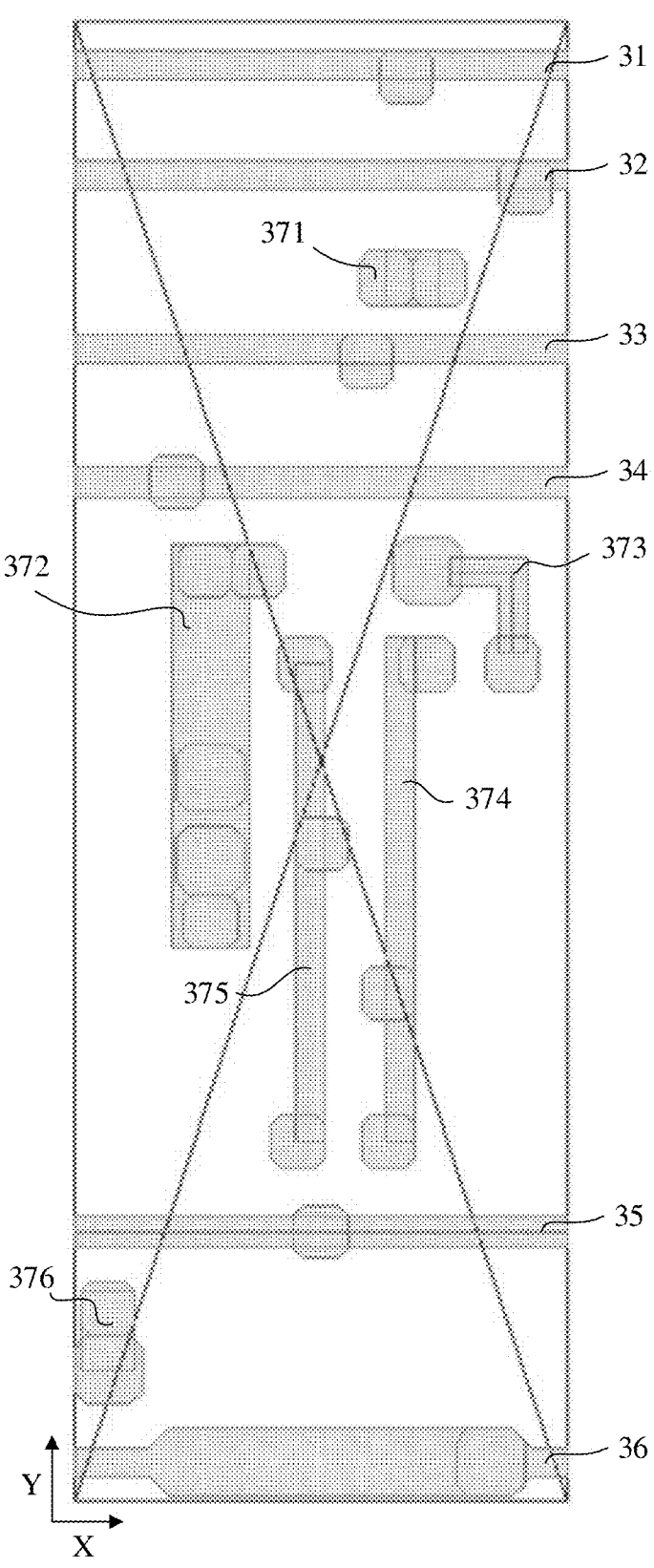
Figure 16F:
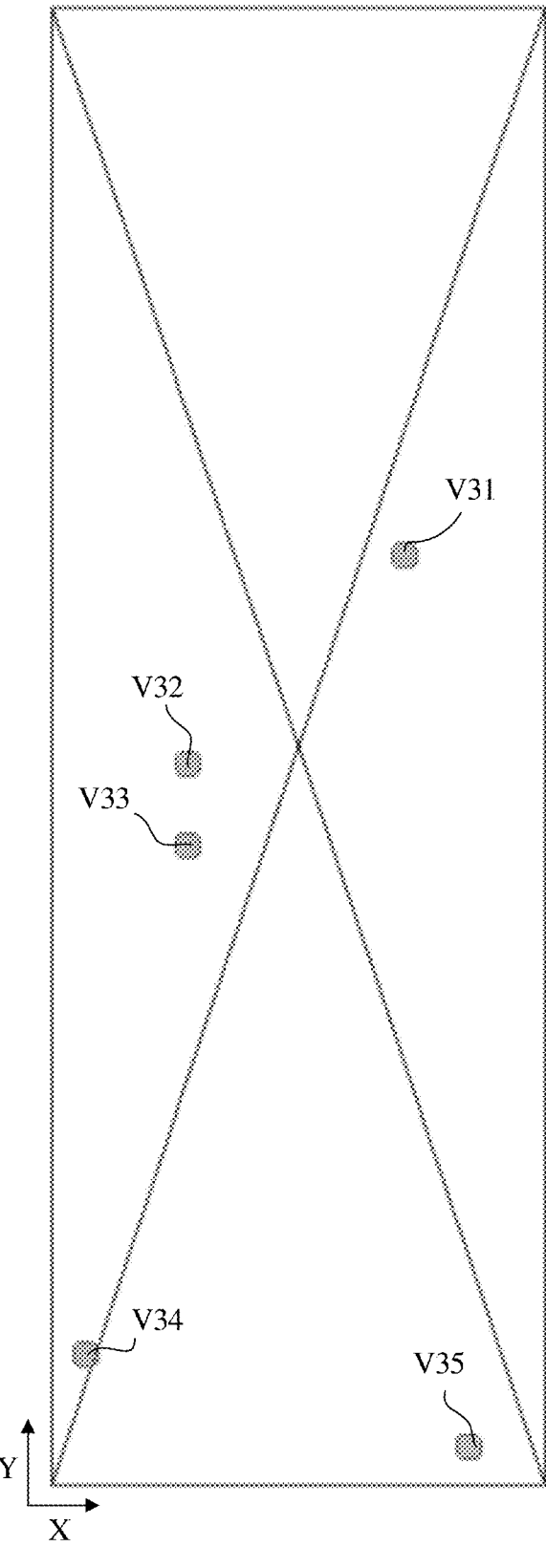
Figure 16G:
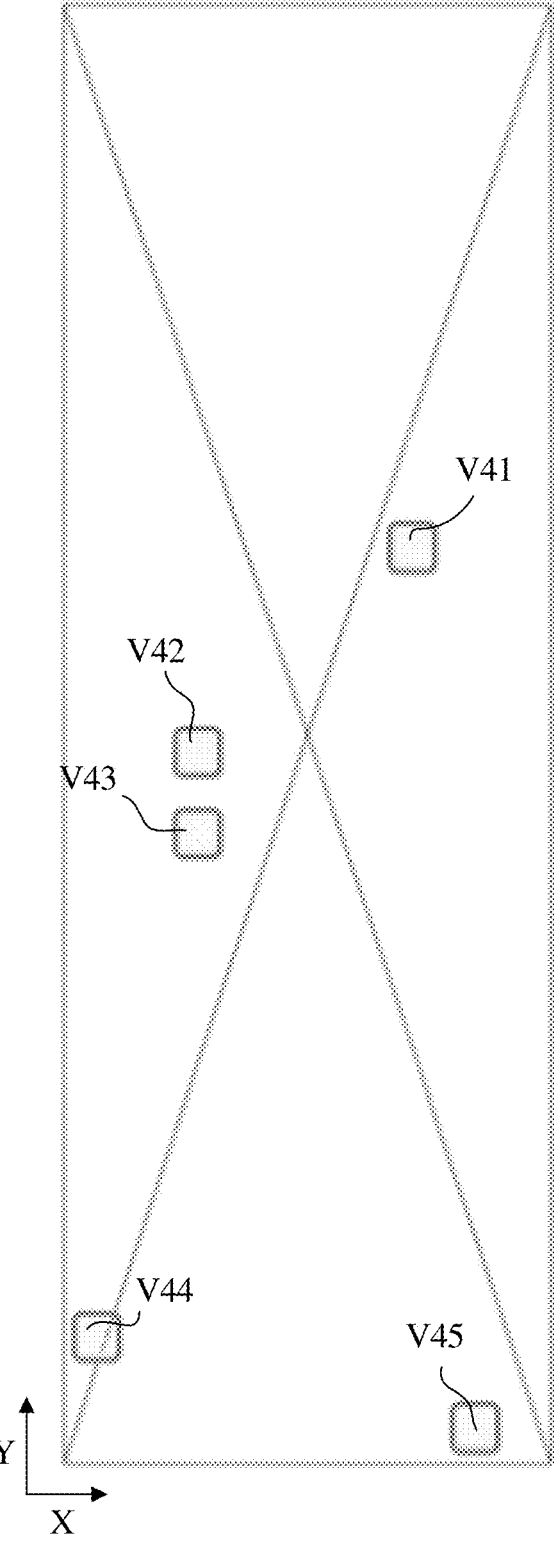
Figure 16H:
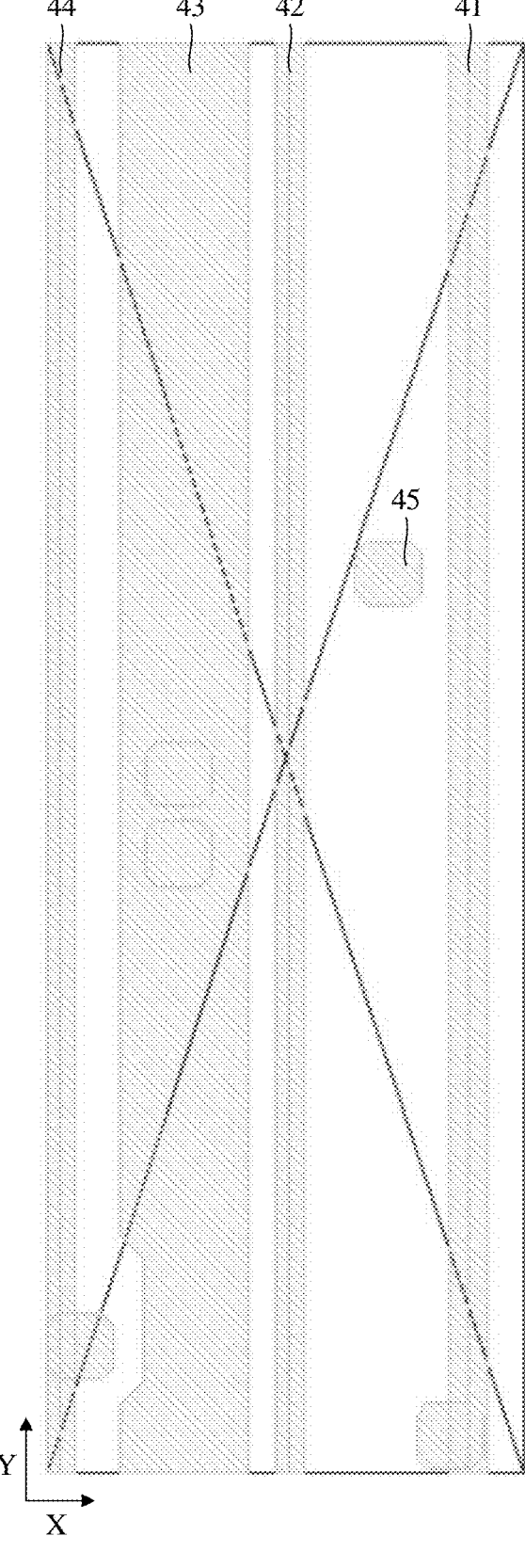

FIG. 16A shows an active layer; FIG. 16B shows a first gate metal layer; FIG. 16C shows a second gate metal layer; FIG. 16D shows an interlayer insulation layer; FIG. 16E shows a first source and drain metal layer; FIG. 16F shows a passivation layer; FIG. 16G shows a first planarization layer; and FIG. 16H shows a second source and drain metal layer.

According to some exemplary embodiments, referring to FIG. 16A, the active layer includes the active portion of at least one of the above transistors. In an example, the active layer includes the active portions of the first transistor T1, the second transistor T2, the third transistor T3, the fourth transistor T4, the fifth transistor T5, the sixth transistor T6, the seventh transistor T7, the eighth transistor T8, and the ninth transistor T9. The active portion of each transistor includes a channel portion, and a first electrode and a second electrode respectively connected to the channel portion on opposite sides of the channel portion. The channel portion, the first electrode and the second electrode of the transistor in the same pixel circuit are formed integrally. For example, the active portion of the first transistor T1 includes the channel portion CH1, and the first electrode S1 and the second electrode D1 respectively connected to the channel portion CH1 on opposite sides of the channel portion CH1. The active portion of the second transistor T2 includes the channel portion CH2, and the first electrode S2 and the second electrode D2 respectively connected to the channel portion CH2 on opposite sides of the channel portion CH2. The active portion of the third transistor T3 includes the channel portion CH3, and the first electrode S3 and the second electrode D3 respectively connected to the channel portion CH3 on opposite sides of the channel portion CH3. The active portion of the fourth transistor T4 includes the channel portion CH4, and the first electrode S4 and the second electrode D4 respectively connected to the channel portion CH4 on opposite sides of the channel portion CH4. The active portion of the fifth transistor T5 includes the channel portion CH5, and the first electrode S5 and the second electrode D5 respectively connected to the channel portion CH5 on opposite sides of the channel portion CH5. The active portion of the sixth transistor T6 includes the channel portion CH6, and the first electrode S6 and the second electrode D6 respectively connected to the channel portion CH6 on opposite sides of the channel portion CH6. The active portion of the seventh transistor T7 includes the channel portion CH7, and the first electrode S7 and the second electrode D7 respectively connected to the channel portion CH7 on opposite sides of the channel portion CH7. The active portion of the eighth transistor T8 includes the channel portion CH8, and the first electrode S8 and the second electrode D8 respectively connected to the channel portion CH8 on opposite sides of the channel portion CH8. The active portion of the ninth transistor T9 includes the channel portion CH9, and the first electrode S9 and the second electrode D9 respectively connected to the channel portion CH9 on opposite sides of the channel portion CH9.

For example, the second transistor T2 is a dual-gate dual-channel transistor, and the channel portion CH2 of the second transistor T2 includes the first sub-channel portion CH21 and the second sub-channel portion CH22 that are spaced apart from each other, and the first sub-channel portion CH21 and the second sub-channel portion CH22 are connected to each other through the channel connection portion CH23.

For example, the fourth transistor T4 is a dual-gate dual-channel transistor, and the channel portion CH4 of the fourth transistor T4 includes the first sub-channel portion CH41 and the second sub-channel portion CH42 that are spaced apart from each other, and the first sub-channel portion CH41 and the second sub-channel portion CH42 are connected to each other through the channel connection portion CH43.

For example, the active portion of the second transistor T2, the active portion of the third transistor T3, the active portion of the seventh transistor T7 and the active portion of the eighth transistor T8 are connected to form an integral structure.

For example, the active portion of the fourth transistor T4 and the active portion of the ninth transistor T9 are connected to form an integral structure.

For example, the active portion of the fifth transistor T5 and the active portion of the sixth transistor T6 are connected to form an integral structure.

For example, each of the active portion of the first transistor T1 and the active portion of the third transistor T3 is in a shape of "Z". Each of the active portion of the second transistor T2, the active portion of the fifth transistor T5, and the active portion of the sixth transistor T6 is in a shape of "U". Each of the active portion of the fourth transistor T4, the active portion of the seventh transistor T7, the active portion of the eighth transistor T8, and the active portion of the ninth transistor T9 is in a shape of straight line.

According to some exemplary embodiments, referring to FIG. 16B, the first gate metal layer may include a first conductive portion 11, a second conductive portion 12, a third conductive portion 13 and a light-emitting control signal line 14.

For example, with reference to FIG. 16A and FIG. 16B, the orthographic projection of the first conductive portion 11 on the base substrate partially overlaps with the orthographic projection of the active portion of the first transistor T1 on the base substrate, and a portion of the first conductive portion 11 overlapping with the active portion of the first transistor T1 serves as the gate G1 of the first transistor T1, and a portion of the active portion of the first transistor T1 overlapping with the first conductive portion 11 serves as the channel portion CH1 of the first transistor T1. There are two overlaps between the orthographic projection of the first conductive portion 11 on the base substrate and the orthographic projection of the active portion of the second transistor T2 on the base substrate. Two portions of the first conductive portion 11 overlapping with the active portion of the second transistor T2 serve as the first gate G21 and the second gate G22 of the second transistor T2, respectively. Two portions of the active portion of the second transistor T2 overlapping with the first conductive portion 11 serve as the first sub-channel portion CH21 and the second sub-channel portion CH22 of the second transistor T2, respectively. A portion connected between the first sub-channel portion CH21 and the second sub-channel portion CH22 is the channel connection portion CH23. The first sub-channel portion CH21, the second sub-channel portion CH22 and the channel connection portion CH23 jointly serve as the channel portion CH2 of the second transistor T2.

For example, with reference to FIG. 16A and FIG. 16B, the orthographic projection of the second conductive portion 12 on the base substrate partially overlaps with the orthographic projection of the active portion of the fifth transistor T5 on the base substrate. A portion of the second conductive portion 12 overlapping with the active portion of the fifth transistor T5 serves as the gate G5 of the fifth transistor T5, and a portion of the active portion of the fifth transistor T5 overlapping with the second conductive portion 12 serves as the channel portion CH5 of the fifth transistor T5. There are two overlaps between the orthographic projection of the second conductive portion 12 on the base substrate and the orthographic projection of the active portion of the fourth transistor T4 on the base substrate. Two portions of the second conductive portion 12 overlapping with the active portion of the second transistor T2 serve as the first gate G41 and the second gate G42 of the fourth transistor T4, respectively. Two portions of the active portion of the fourth transistor T4 overlapping with the second conductive portion 12 serve as the first sub-channel portion CH41 and the second sub-channel portion CH42 of the fourth transistor T4, respectively. The portion connected between the first sub-channel portion CH41 and the second sub-channel portion CH42 is the channel connection portion CH43. The first sub-channel portion CH41, the second sub-channel portion CH42 and the channel connection portion CH43 jointly serve as the channel portion CH4 of the fourth transistor T4. The orthographic projection of the second conductive portion 12 on the base substrate partially overlaps with an orthographic projection of the active portion of the eighth transistor T8 on the base substrate, a portion of the second conductive portion 12 overlapping with the active portion of the eighth transistor T8 serves as a gate G8 of the eighth transistor T8, and a portion of the active portion of the eighth transistor T8 overlapping with the second conductive portion 12 serves as the channel portion CH8 of the eighth transistor T8.

For example, referring to FIG. 16A and FIG. 16B, an orthographic projection of the third conductive portion 13 on the base substrate partially overlaps with the orthographic projection of the active portion of the third transistor T3 on the base substrate, and a portion of the second conductive portion 12 overlapping with the active portion of the third transistor T3 serves as the gate G3 of the third transistor T3, and a portion of the active portion of the third transistor T3 overlapping with the second conductive portion 12 serves as the channel portion CH3 of the third transistor T3. The third conductive portion 13 may be further used as a first electrode plate of the storage capacitor.

For example, referring to FIG. 16A and FIG. 16B, a main body portion of the light-emitting control signal line 14 extends in the first direction. An orthographic projection of the light-emitting control signal line 14 on the base substrate partially overlaps with an orthographic projection of the active portion of the sixth transistor T6 on the base substrate, a portion of the light-emitting control signal line 14 overlapping with the active portion of the sixth transistor T6 serves as the gate G6 of the sixth transistor T6, and a portion of the active portion of the sixth transistor T6 overlapping with the light-emitting control signal line 14 serves as the channel portion CH6 of the sixth transistor T6. An orthographic projection of the light-emitting control signal line 14 on the base substrate partially overlaps with an orthographic projection of the active portion of the seventh transistor T7 on the base substrate, a portion of the light-emitting control signal line 14 overlapping with the active portion of the seventh transistor T7 serves as the gate G7 of the seventh transistor T7, and a portion of the active portion of the seventh transistor T7 overlapping with the light-emitting control signal line 14 serves as the channel portion CH7 of the seventh transistor T7. An orthographic projection of the light-emitting control signal line 14 on the base substrate partially overlaps with an orthographic projection of the active portion of the ninth transistor T9 on the base substrate, a portion of the light-emitting control signal line 14 overlapping with the active portion of the ninth transistor T9 serves as the gate G9 of the ninth transistor T9, and a portion of the active portion of the ninth transistor T9 overlapping with the light-emitting control signal line 14 serves as the channel portion CH9 of the ninth transistor T9.

According to some exemplary embodiments, referring to FIG. 16C, the second gate metal layer may include a first power grid line 21, a fourth conductive portion 22, a second initialization connection portion 23, and a shielding portion 24.

For example, referring to FIG. 16C, the first power grid line 21 extends in the first direction X, and the first power grid line 21 is used to transmit the first power signal.

For example, referring to FIG. 16B and FIG. 16C, an orthographic projection of the fourth conductive portion 22 on the base substrate at least partially overlaps with the orthographic projection of the third conductive portion 13 on the base substrate, and the fourth conductive portion 22 serves as a second electrode plate of the storage capacitor. The fourth conductive portion 22 has a hollow structure 221, and an orthographic projection of the hollow structure 221 on the base substrate falls within the orthographic projection of the third conductive portion 13 on the base substrate.

For example, referring to FIG. 16A and FIG. 16C, the second initialization connection portion 23 and the shielding portion 24 are connected to form an integral structure. The orthographic projection of the shielding portion 24 on the base substrate at least partially overlaps with the orthographic projection of the channel connection portion CH23 on the base substrate.

According to some exemplary embodiments, referring to FIG. 16D, the interlayer insulation layer includes a plurality of via holes, for example, the interlayer insulation layer includes a first via hole V11, a second via hole V12, a third via hole V13, a fourth via hole V14, a fifth via hole V15, a sixth via hole V16, a seventh via hole V17, an eighth via hole V18, a ninth via hole V19, a tenth via hole V20, an eleventh via hole V21, a twelfth via hole V22, a thirteenth via hole V23, a fourteenth via hole V24, a fifteenth via hole V25, a sixteenth via hole V26, a seventeenth via hole V27, and an eighteenth via hole V28.

According to some exemplary embodiments, referring to FIG. 16E, the first source and drain metal layer may include the first initialization signal line 31, the second initialization signal line 32, a reset signal line 33, the reference voltage signal line 34, the scanning signal line 35, the second power grid line 36, the first initialization connection portion 371, the first power signal connection portion 372, a third connection structure 373, a fourth connection structure 374, a fifth connection structure 375, and a sixth connection structure 376.

For example, referring to FIG. 16A, FIG. 16C, FIG. 16D and FIG. 16E, the first initialization signal line 31 extends in the first direction X, and the first initialization signal line 31 is used to transmit the first initialization signal. The first initialization signal line 31 is electrically connected to the second initialization connection portion 23 through the first via hole V11. The first initialization connection portion 371 is electrically connected to the second initialization connection portion 23 through the third via hole V13, and the first initialization connection portion 371 is electrically connected to the first electrode S4 of the fourth transistor T4 through the fourth via hole V14. That is, the first initialization signal line 31 is electrically connected to the first electrode S4 of the fourth transistor T4 through the second initialization connection portion 23 and the first initialization connection portion 371.

For example, referring to FIG. 16A, FIG. 16D and FIG. 16E, the second initialization signal line 32 extends in the first direction X, and the second initialization signal line 32 is used to transmit the second initialization signal. The second initialization signal line 32 is electrically connected to the first electrode S8 of the eighth transistor T8 through the second via hole V12.

For example, referring to FIG. 16B, FIG. 16D and FIG. 16E, the reset signal line 33 extends in the first direction X, and the reset signal line 33 is used to transmit the reset signal. The reset signal line 33 is electrically connected to the second conductive portion 12 through the fifth via hole V15.

For example, referring to FIG. 16A, FIG. 16D and FIG. 16E, the reference voltage signal line 34 extends in the first direction X, and the reference voltage signal line 34 is used to transmit the reference voltage signal. The reference voltage signal line 34 is electrically connected to the first electrode S5 of the fifth transistor T5 and the first electrode S6 of the sixth transistor T6 through the sixth via hole V16.

For example, referring to FIG. 16B, FIG. 16D and FIG. 16E, the scanning signal line 35 extends in the first direction X, and the scanning signal line 35 is used to transmit the scanning signal. The scanning signal line 35 is electrically connected to the first conductive portion 11 through the seventeenth via hole V27.

For example, referring to FIG. 16E, the second power grid line 36 extends in the first direction X, and the second power grid line 36 is used to transmit the second power signal.

For example, referring to FIG. 16A, FIG. 16C, FIG. 16D and FIG. 16E, the first power signal connection portion 372 extends in the second direction Y, the first power signal connection portion 372 is electrically connected to the first power grid line 21 through the seventh via hole V17 and the eighth via hole V18, and the first power signal connection portion 372 is electrically connected to the first electrode S3 of the third transistor T3 through the thirteenth via hole V23. That is, the first power grid line 21 is electrically connected to the first electrode S3 of the third transistor T3 through the first power signal connection portion 372.

For example, referring to FIG. 16A, FIG. 16D and FIG. 16E, the third connection structure 373 is electrically connected to the second electrode D2 of the seventh transistor T7 through the eleventh via hole V21.

For example, referring to FIG. 16A to FIG. 16E, the fourth connection structure 374 is electrically connected to the first electrode S9 of the ninth transistor T9 through the tenth via hole V20, the fourth connection structure 374 is electrically connected to the gate G3 of the third transistor T3 through the fourth via hole V14 and the hollow structure 221 of the fourth conductive portion 22, and the fourth connection structure 374 is electrically connected to the second electrode D2 of the second transistor T2 through the fifteenth via hole V25. That is, the first electrode S9 of the ninth transistor T9, the gate G3 of the third transistor T3 and the second electrode D2 of the second transistor T2 are electrically connected to the same node through the fourth connection structure 374.

For example, in combination with reference to FIG. 16A, FIG. 16C, FIG. 16D and FIG. 16E, the fifth connection structure 375 is electrically connected to the second electrode D5 of the fifth transistor T5 and the second electrode D6 of the sixth transistor T6 through the ninth via hole V19, the fifth connection structure 375 is electrically connected to the fourth conductive portion 22 through the twelfth via hole V22, and the fifth connection structure 375 is electrically connected to the second electrode D1 of the first transistor T1 through the fifteenth via hole V25. That is, the second electrode D5 of the fifth transistor T5, the second electrode D6 of the sixth transistor T6, the second electrode plate of the storage capacitor and the second electrode D1 of the first transistor T1 are electrically connected to the same node through the fifth connection structure 375.

For example, referring to FIG. 16A, FIG. 16D and FIG. 16E, the sixth connection structure 376 is electrically connected to the first electrode S1 of the first transistor T1 through the eighteenth via hole V28.

According to some exemplary embodiments, referring to FIG. 16F, the passivation layer includes a first via hole V31, a second via hole V32, a third via hole V33, a fourth via hole V34 and a fifth via hole V35.

According to some exemplary embodiments, referring to FIG. 16G, the first planarization layer includes a first via hole V41, a second via hole V42, a third via hole V43, a fourth via hole V44, and a fifth via hole V45. Referring to FIG. 16F and FIG. 16G, the first via hole V41 is sleeved on the first via hole V31, that is, an orthographic projection of the first via hole V41 on the base substrate covers an orthographic projection of the first via hole V31 on the base substrate. The second via hole V42 is sleeved on the second via hole V32, that is, an orthographic projection of the second via hole V42 on the base substrate covers an orthographic projection of the second via hole V32 on the base substrate. The third via hole V43 is sleeved on the third via hole V33, that is, an orthographic projection of the third via hole V43 on the base substrate covers an orthographic projection of the third via hole V33 on the base substrate. The fourth via hole V44 is sleeved on the fourth via hole V34, that is, an orthographic projection of the fourth via hole V44 on the base substrate covers the orthographic projection of the fourth via hole V34 on the base substrate. The fifth via hole V45 is sleeved on the fifth via hole V35, that is, an orthographic projection of the fifth via hole V45 on the base substrate covers an orthographic projection of the fifth via hole V35 on the base substrate.

According to some exemplary embodiments, referring to FIG. 16H, the second source and drain metal layer may include a second power signal line 41, a grid line 42, a first power signal line 43, a data line 44, and a first electrode connection portion 45.

According to some exemplary embodiments, referring to FIGS. 16E, 16F, 16G, and 16H, the second power signal line 41 extends in the second direction Y, and the second power signal line 41 is used to transmit the second power signal. The second power signal line 41 is electrically connected to the second power grid line 36 through the fifth via hole V45 and the fifth via hole V35.

According to some exemplary embodiments, referring to FIG. 16E and FIG. 16H, the grid line 42 extends in the second direction Y. A portion of the grid line 42 may be electrically connected to the first initialization signal line 31, another portion of the grid line 42 may be electrically connected to the second initialization signal line 32, and yet another portion of the grid line 42 may be electrically connected to the reference voltage signal line 34.

According to some exemplary embodiments, referring to FIG. 16E, FIG. 16F, FIG. 16G, and FIG. 16H, the first power signal line 43 extends in the second direction Y, and the first power signal line 43 is used to transmit the first power signal. The first power signal line 43 is electrically connected to the first power signal connection portion 372 through the third via hole V43, the third via hole V33, the second via hole V42 and the second via hole V32, that is, the first power signal line 43 is electrically connected to the first power grid line 21 through the first power signal connection portion 372.

According to some exemplary embodiments, with reference to FIG. 16E, FIG. 16F, FIG. 16G and FIG. 16H, the data line 44 extends in the second direction Y, and the data line 44 is used to transmit the data signal. The data line 44 is electrically connected to the sixth connection structure 376 through the fourth via hole V44 and the fourth via hole V34, that is, the data line 44 is electrically connected to the first electrode S1 of the first transistor T1 through the sixth connection structure 376.

According to some exemplary embodiments, with reference to FIG. 16E, FIG. 16F, FIG. 16G and FIG. 16H, the first electrode connection portion 45 is electrically connected to the third connection structure 373 through the first via hole V41 and the first via hole V31, that is, the first electrode connection portion 45 is electrically connected to the second electrode D2 of the seventh transistor T7 through the third connection structure 373, and the first electrode connection portion 45 is further electrically connected to the first electrode located on an upper side.

According to some exemplary embodiments, the first gate metal layer, the second gate metal layer, the first source and drain metal layer, and the second source and drain metal layer may be made of metal material(s), such as any one or more of silver (Ag), copper (Cu), aluminum (Al) and molybdenum (Mo), or alloy material(s) of the above metals, such as aluminum-neodymium alloy (AlNd) or molybdenum-niobium alloy (MoNb), and they may have a single-layer structure, or a multi-layer composite structure, such as Mo/Cu/Mo, etc. The first gate insulation layer, the second gate insulation layer, the interlayer insulation layer and the passivation layer may be made of any one or more of silicon oxide (SiOx), silicon nitride (SiNx) and silicon oxynitride (SiON), and may have a single-layer, multi-layer or composite layer structure. The first planarization layer and the second planarization layer may be made of organic material(s), such as resin, etc.

At least some embodiments of the present disclosure further provide a display device, which includes the display substrate as described above. The display device may include any device or product having a display function. For example, the display device may be a smart phone, a mobile phone, an e-book reader, a desktop computer (PC), a laptop PC, a netbook PC, a personal digital assistant (PDA), a portable multimedia player (PMP), a digital audio player, a mobile medical device, a camera, a wearable device (such as a head-mounted device, an electronic clothing, an electronic bracelet, an electronic necklace, an electronic accessory, an electronic tattoo, or a smart watch), a television, etc.

It will be understood that the display device according to embodiments of the present disclosure has all the characteristics and advantages of the above-mentioned display substrate. Details may be referred back to the above description and will not be repeated here. Although the overall technical concept of the present disclosure is shown and described in some embodiments, those skilled in the art will appreciate that changes may be made to these embodiments without departing from the principles and spirit of the overall technical concept, and the scope of the present disclosure is defined by the claims and their equivalents.

What is claimed is:

1. A display substrate, comprising a display region and a peripheral region around the display region, wherein the display substrate comprises:

a base substrate; and a plurality of sub-pixels on the base substrate, arranged in the display region and in a first direction and/or a second direction, the first direction intersecting with the second direction, wherein the sub-pixel comprises a light-emitting element and a driving circuit electrically connected to the light-emitting element, the driving circuit comprises a plurality of transistors and at least one storage capacitor, the plurality of transistors comprise a first transistor, a second transistor and a third transistor, the at least one storage capacitor comprises a first storage capacitor, a first electrode of the first transistor is configured to receive a data signal, a second electrode of the first transistor is electrically connected to a second electrode plate of the first storage capacitor, a first electrode of the second transistor is electrically connected to a second electrode of the third transistor, and a second electrode of the second transistor is electrically connected to a gate of the third transistor, a first electrode of the third transistor is configured to receive a first power signal, and the gate of the third transistor is electrically connected to a first electrode plate of the first storage capacitor, wherein the second transistor comprises an active portion, the active portion of the second transistor comprises a channel portion, and a first electrode and a second electrode respectively connected to the channel portion on opposite sides of the channel portion, and the channel portion comprises a first sub-channel portion, a second sub-channel portion, and a channel connection portion connected between the first sub-channel portion and the second sub-channel portion; and wherein the display substrate further comprises a shielding portion on the base substrate, a layer in which the shielding portion is located is arranged on a side of a layer in which the active portion of the second transistor is located away from the base substrate, and an orthographic projection of the shielding portion on the base substrate at least partially overlaps with an orthographic projection of the channel connection portion on the base substrate.

2. The display substrate according to claim 1, wherein the shielding portion is configured to receive a constant voltage signal.

3. The display substrate according to claim 2, wherein the plurality of transistors further comprise a fourth transistor, a first electrode of the fourth transistor is configured to receive a first initialization signal, a second electrode of the fourth transistor is electrically connected to the gate of the third transistor, and the shielding portion is configured to receive the first initialization signal.

4. The display substrate according to claim 3, wherein the display substrate further comprises a first initialization signal line configured to transmit the first initialization signal; and wherein the shielding portion is electrically connected to the first initialization signal line.

5. The display substrate according to claim 4, wherein the display substrate comprises a third conductive layer on the base substrate and a second conductive layer on a side of the third conductive layer away from the base substrate, the first initialization signal line is arranged in the second conductive layer;

wherein the second conductive layer further comprises a first initialization connection portion spaced apart from the first initialization signal line, the third conductive layer comprises a second initialization connection portion, the second initialization connection portion is electrically connected to the first initialization signal line and the first initialization connection portion, the first initialization connection portion is further electrically connected to the first electrode of the fourth transistor; and wherein the shielding portion is arranged in the third conductive layer, and the shielding portion and the second initialization connection portion are connected to form an integral structure.

6. The display substrate according to claim 2, wherein a second electrode of the light-emitting element is configured to receive a second power signal, and the shielding portion is configured to receive the second power signal.

7. The display substrate according to claim 6, wherein the display substrate further comprises a second power signal transmission structure configured to transmit the second power signal, and the shielding portion is electrically connected to the second power signal transmission structure.

8. The display substrate according to claim 7, wherein the display substrate comprises a second conductive layer on the base substrate and a first conductive layer on a side of the second conductive layer away from the base substrate;

wherein the second power signal transmission structure comprises a second power signal line arranged in the first conductive layer and a second power grid line arranged in the second conductive layer, the second power grid line extends in the first direction, the second power signal line extends in the second direction, and the second power grid line is electrically connected to the second power signal line; and wherein the shielding portion is arranged in the first conductive layer, and the shielding portion and the second power signal line are connected to form an integral structure.

9. The display substrate according to claim 2, wherein the shielding portion is configured to receive the first power signal; or wherein the plurality of transistors further comprise a fifth transistor, a first electrode of the fifth transistor is configured to receive a reference voltage signal, a second electrode of the fifth transistor is electrically connected to the second electrode of the first transistor, and the shielding portion is configured to receive the reference voltage signal; or wherein the plurality of transistors further comprise an eighth transistor, a first electrode of the eighth transistor is configured to receive a second initialization signal, a second electrode of the eighth transistor is electrically connected to a first electrode of the light-emitting element, and the shielding portion is configured to receive the second initialization signal.

10. The display substrate according to claim 1, further comprising a scanning signal line configured to transmit a scanning signal to a gate of the second transistor, wherein the orthographic projection of the shielding portion on the base substrate is spaced apart from an orthographic projection of the scanning signal line on the base substrate, and/or the orthographic projection of the shielding portion on the base substrate is spaced apart from an orthographic projection of the gate of the second transistor on the base substrate.

11. The display substrate according to claim 1, wherein the display substrate comprises an active layer on the base substrate and a light shielding layer between the active layer and the base substrate, a plurality of active portions of the plurality of transistors are arranged in the active layer, and an orthographic projection of the light shielding layer on the base substrate at least partially overlaps with orthographic projections of the plurality of active portions on the base substrate.

12. The display substrate according to claim 11, wherein the plurality of transistors further comprise a fourth transistor, a fifth transistor, a sixth transistor, a seventh transistor, and an eighth transistor;

a first electrode of the fourth transistor is configured to receive a first initialization signal, and a second electrode of the fourth transistor is electrically connected to the gate of the third transistor;

a first electrode of the fifth transistor is configured to receive a reference voltage signal, and a second electrode of the fifth transistor is electrically connected to the second electrode of the first transistor;

a first electrode of the sixth transistor is configured to receive to the reference voltage signal, and a second electrode of the sixth transistor is electrically connected to the second electrode of the first transistor;

a first electrode of the seventh transistor is electrically connected to the second electrode of the third transistor, and a second electrode of the seventh transistor is electrically connected to a first electrode of the light-emitting element;

a first electrode of the eighth transistor is configured to receive a second initialization signal, and a second electrode of the eighth transistor is electrically connected to the first electrode of the light-emitting element; and each of a gate of the first transistor and a gate of the second transistor is configured to receive to a scanning signal, each of a gate of the fourth transistor, a gate of the fifth transistor and a gate of the eighth transistor is configured to receive to a reset signal, and each of a gate of the sixth transistor and a gate of the seventh transistor is configured to receive to a light-emitting control signal; and wherein the orthographic projection of the light shielding layer on the base substrate at least partially overlaps with an orthographic projection of each of an active portion of the first transistor, the active portion of the second transistor, an active portion of the third transistor, an active portion of the fourth transistor, an active portion of the fifth transistor and an active portion of the eighth transistor on the base substrate.

13. The display substrate according to claim 11, wherein the light shielding layer is configured to receive the first power signal.

14. The display substrate according to claim 13, wherein the display substrate further comprises a first power signal transmission structure configured to transmit the first power signal, wherein the first power signal transmission structure comprises a plurality of first power signal lines and a plurality of first power signal connection portions, the plurality of first power signal lines are arranged in the first direction and extend in the second direction, the first power signal connection portion is electrically connected to the first power signal line, and the first power signal connection portion is electrically connected to the first electrode of the third transistor;

wherein the display substrate comprises a second conductive layer on a side of the active layer away from the base substrate and a first conductive layer on a side of the second conductive layer away from the base substrate, the plurality of first power signal lines are arranged in the first conductive layer, and the plurality of first power signal connection portions are arranged in the second conductive layer; and wherein the light shielding layer is electrically connected to at least one of the plurality of first power signal connection portions.

15. The display substrate according to claim 11, wherein the plurality of transistors further comprises a fifth transistor, a first electrode of the fifth transistor is configured to receive a reference voltage signal, a second electrode of the fifth transistor is electrically connected to the second electrode of the first transistor, and the light shielding layer is configured to receive the reference voltage signal.

16. The display substrate according to claim 15, wherein the display substrate further comprises a reference voltage signal line configured to transmit the reference voltage signal;

wherein the display substrate further comprises:

a second conductive layer on a side of the active layer away from the base substrate, the reference voltage signal line being arranged in the second conductive layer; and a first insulation layer between the light shielding layer and the active layer and a second insulation layer between the active layer and the second conductive layer, wherein the second insulation layer includes a first via hole, and the first insulation layer and the second insulation layer include a second via hole, the first via hole exposes at least part of the first electrode of the fifth transistor, the second via hole exposes at least part of the light shielding layer, the reference voltage signal line is electrically connected to the first electrode of the fifth transistor through the first via hole, and the reference voltage signal line is electrically connected to the light shielding layer through the second via hole; and wherein an orthographic projection of the second via hole on the base substrate is adjacent to an orthographic projection of the first via hole on the base substrate.

17. The display substrate according to claim 1, wherein the display substrate comprises a driving circuit layer on the base substrate and a light-emitting element layer on a side of the driving circuit layer away from the base substrate, wherein each driving circuit is arranged in the driving circuit layer, and each light-emitting element is arranged in the light-emitting element layer;

wherein the display substrate comprises a second power signal transmission structure arranged in the driving circuit layer and configured to transmit a second power signal, and the second power signal transmission structure comprises at least one auxiliary electrode arranged in the display region; and wherein the light-emitting element layer comprises a first electrode layer on the side of the driving circuit layer away from the base substrate, a light-emitting function layer on a side of the first electrode layer away from the base substrate, and a second electrode layer on a side of the light-emitting function layer away from the base substrate, the second electrode layer is electrically connected to the auxiliary electrode.

18. The display substrate according to claim 17, wherein the driving circuit layer comprises a second conductive layer on the base substrate and a first conductive layer on a side of the second conductive layer away from the base substrate; and the second power signal transmission structure comprises a second power signal line and a second power grid line, the second power signal line extends in the second direction and is arranged in the first conductive layer, the second power grid line extends in the first direction and is arranged in the second conductive layer, and the second power grid line is electrically connected to the second power signal line; and wherein the auxiliary electrode is arranged in the first conductive layer, and the auxiliary electrode and the second power signal line are connected to form an integral structure.

19. The display substrate according to claim 18, wherein the first electrode layer comprises a plurality of first electrodes arranged at intervals, and an orthographic projection of the auxiliary electrode on the base substrate is located between orthographic projections of at least two of the plurality of first electrodes on the base substrate.

20. A display device, comprising the display substrate according to claim 1.

\* \* \* \* \*